(12) United States Patent
Kondo et al.

(10) Patent No.: US 9,020,041 B2
(45) Date of Patent: *Apr. 28, 2015

(54) VARIABLE LENGTH CODING METHOD AND VARIABLE LENGTH DECODING METHOD

(75) Inventors: Satoshi Kondo, Yawata (JP); Shinya Kadono, Nishinomiya (JP); Makoto Hagai, Moriguchi (JP); Kiyofumi Abe, Kadoma (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 1897 days.

This patent is subject to a terminal disclaimer.

(21) Appl. No.: 11/907,777

(22) Filed: Oct. 17, 2007

(65) Prior Publication Data

US 2008/0063083 A1 Mar. 13, 2008

Related U.S. Application Data

(62) Division of application No. 10/478,185, filed as application No. PCT/JP03/04803 on Apr. 16, 2003, now Pat. No. 7,305,035.

(30) Foreign Application Priority Data

Apr. 19, 2002 (JP) .................................. 2002-118483
Apr. 26, 2002 (JP) .................................. 2002-126029
Dec. 13, 2002 (JP) .................................. 2002-363106

(51) Int. Cl.
*H04B 1/66* (2006.01)
*H03M 7/40* (2006.01)
(Continued)

(52) U.S. Cl.
CPC .............. *H03M 7/40* (2013.01); *H03M 7/4006* (2013.01); *H04N 19/13* (2014.11); *H04N 19/134* (2014.11);
(Continued)

(58) Field of Classification Search
CPC .................... H04N 19/0075; H04N 19/00951; H04N 19/00; H04N 19/0003; H04N 19/00193; H04N 19/00478; H04N 19/00587; H04N 7/50; H04N 7/26106; H04N 7/26244; H04N 7/26313; H04N 19/00781; H04N 19/00957; H04N 19/00121; H04N 19/00133; H04N 19/00157; H04N 19/002
USPC ........ 375/240.17–240.34, 240.16; 348/402.1; 382/253, 248, 259, 232, 234, 238
IPC ...................................... H04B 1/66; H04N 7/12
See application file for complete search history.

(56) References Cited

U.S. PATENT DOCUMENTS 4,541,012 A 9/1985 Tescher
5,367,629 A 11/1994 Chu et al.
(Continued)

FOREIGN PATENT DOCUMENTS

EP 0 267 578 5/1988
EP 0 616 471 9/1994
(Continued)

OTHER PUBLICATIONS

"Information Technology—Coding of Moving Pictures and Associated Audio for Digital Storage Media at Up to About 1,5 Mbits/s—Part 2" Apr. 15, 1996, International Organisation for Standardization ISO/IEC 11172-2, Switzerland 11172, pp. 88-93, XP002292446.

(Continued)

*Primary Examiner* — Tung Vo
(74) *Attorney, Agent, or Firm* — Wenderoth, Lind & Ponack, L.L.P.

(57) ABSTRACT

A variable length coding method is provided for coding coefficients in each block which are obtained by performing frequency transformation on picture data of a moving picture per block having a predetermined size, and includes: a coefficient scanning step of scanning the coefficients in the block in a predetermined order; and a coding step of coding the coefficients scanned in the coefficient scanning step into variable length codes in a predetermined order by switching a plurality of tables to be used for coding. Here, a direction of switching between the tables may be one-directional. Also, the coding may be non-arithmetic coding.

2 Claims, 36 Drawing Sheets

(51) Int. Cl.
*H04N 19/13* (2014.01)
*H04N 19/134* (2014.01)
*H04N 19/61* (2014.01)
*H04N 19/60* (2014.01)
*H04N 19/14* (2014.01)
*H04N 19/18* (2014.01)
*H04N 19/93* (2014.01)
*H04N 7/12* (2006.01)

(52) U.S. Cl.
CPC ............... *H04N 19/61* (2014.11); *H04N 19/60* (2014.11); *H04N 19/14* (2014.11); *H04N 19/18* (2014.11); *H04N 19/93* (2014.11)

(56) References Cited

U.S. PATENT DOCUMENTS

| | | | |
|---|---|---|---|
| 5,510,785 A | | 4/1996 | Segawa et al. |
| 5,528,628 A | | 6/1996 | Park et al. |
| 5,539,401 A | * | 7/1996 | Kumaki et al. .................. 341/67 |
| 5,751,232 A | | 5/1998 | Inoue et al. |
| 5,774,594 A | * | 6/1998 | Kitamura ...................... 382/239 |
| 5,796,435 A | * | 8/1998 | Nonomura et al. ....... 375/240.03 |
| 5,818,877 A | * | 10/1998 | Tsai et al. ..................... 375/241 |
| 5,883,976 A | | 3/1999 | Ohsawa |
| 5,995,148 A | | 11/1999 | Haskell et al. |
| 6,014,095 A | * | 1/2000 | Yokoyama ...................... 341/67 |
| 6,104,754 A | | 8/2000 | Chujoh et al. |
| 6,111,987 A | | 8/2000 | Watanabe et al. |
| 6,140,944 A | * | 10/2000 | Toyoyama ...................... 341/63 |
| 6,144,322 A | * | 11/2000 | Sato ................................ 341/67 |
| 6,271,885 B2 | | 8/2001 | Sugiyama |
| 6,546,145 B1 | | 4/2003 | Miyake et al. |
| 6,646,578 B1 | | 11/2003 | Au |
| 6,696,993 B2 | * | 2/2004 | Karczewicz ...................... 341/67 |
| 6,704,494 B1 | * | 3/2004 | Chujoh et al. .................. 386/253 |
| 6,748,113 B1 | * | 6/2004 | Kondo et al. .................. 382/232 |
| 6,829,300 B1 | | 12/2004 | Ichioka |
| 6,954,555 B2 | * | 10/2005 | Shimada ...................... 382/246 |
| 6,993,202 B2 | * | 1/2006 | Igarashi et al. ............... 382/246 |
| 7,099,387 B2 | * | 8/2006 | Bjontegaard et al. ......... 375/240 |
| 7,305,035 B2 | * | 12/2007 | Kondo et al. ............ 375/240.23 |
| 7,423,562 B2 | * | 9/2008 | Kim et al. ........................ 341/67 |
| 7,602,850 B2 | * | 10/2009 | Reese ...................... 375/240.23 |
| 7,643,694 B2 | * | 1/2010 | Srinidhi ........................ 382/250 |
| 7,714,752 B2 | * | 5/2010 | Kadono et al. .................. 341/67 |
| 7,742,528 B2 | * | 6/2010 | Kondo et al. ............ 375/240.23 |
| 7,813,567 B2 | * | 10/2010 | Sankaran ...................... 382/232 |
| 7,817,864 B2 | * | 10/2010 | Chiba et al. ................... 382/232 |
| 7,843,997 B2 | * | 11/2010 | Hellman ................... 375/240.18 |
| 7,856,147 B2 | * | 12/2010 | Srinidhi ........................ 382/235 |
| 7,876,257 B2 | * | 1/2011 | Vetro et al. ................... 342/25 F |
| 7,885,473 B2 | * | 2/2011 | Sankaran ...................... 382/232 |
| 7,903,973 B1 | * | 3/2011 | Uhlhorn et al. .................. 398/77 |
| 7,912,712 B2 | * | 3/2011 | Shlomot et al. ................ 704/226 |
| 7,920,629 B2 | * | 4/2011 | Bjontegaard et al. .... 375/240.18 |
| 7,956,774 B2 | * | 6/2011 | Kadono et al. .................. 341/67 |
| 7,970,059 B2 | * | 6/2011 | Kondo et al. ............ 375/240.23 |

FOREIGN PATENT DOCUMENTS

| | | |
|---|---|---|
| EP | 0 762 771 A2 | 3/1997 |
| EP | 0 827 345 | 3/1998 |
| EP | 1 150 434 A1 | 10/2001 |
| EP | 001424856 A1 | 6/2004 |
| JP | 4-100390 | 4/1992 |
| JP | 4-315270 | 11/1992 |
| JP | 5-95484 | 4/1993 |
| JP | 5-347710 | 12/1993 |
| JP | 6-178282 | 6/1994 |
| JP | 6-232765 | 8/1994 |
| JP | 6-343168 | 12/1994 |
| JP | 7-59086 | 3/1995 |
| JP | 8-186722 | 7/1996 |
| JP | 8-214310 | 8/1996 |
| JP | 9-172379 | 6/1997 |
| JP | 9-307901 | 11/1997 |
| JP | 11-243343 | 9/1999 |
| JP | 11-341497 | 12/1999 |
| JP | 2001-24515 | 1/2001 |

OTHER PUBLICATIONS

Hartung F. et al., "Improved Encoding of DCT Coefficients for Low Bit-Rate Video Coding Using Multiple VLC Tables" Image Processing, 1999. ICIP 99. Proceedings. 1999 International Conference on Kobe, Japan Oct. 24-28, 1999, Piscataway, NJ, USA, IEEE, US Oct. 24, 1999, pp. 51-55, XP010368953.

Jeon B. et al., "Huffman Coding of DCT Coefficients Using Dynamic Codeword Assignment and Adaptive Codebook Selection" Signal Processing. Image Communication, Elsevier Science Publishers, Amsterdam, NL, vol. 12, No. 3, Jun. 1, 1998, pp. 253-262, XP004122852.

* cited by examiner

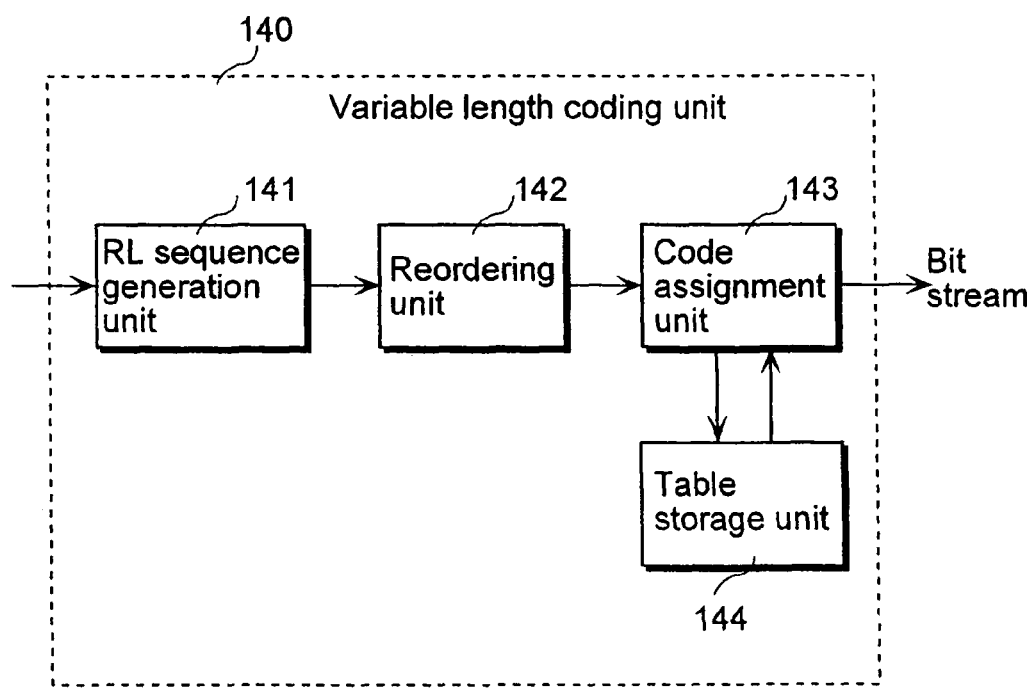

Fig. 3A

|  |  |  |  |
|---|---|---|---|
| -38 | 9 | 3 | 0 |
| -5 | -31 | 2 | 0 |
| 22 | -12 | -2 | 1 |
| 4 | 3 | -1 | 0 |

Fig. 4A (0,-38)
(0,9)
(0,-5)
(0,22)
(0,-31)
(0,3)
(1,2)
(0,-12)
(0,4)
(0,3)
(0,-2)
(1,1)
(0,-1)
EOB(End Of Block)

Fig. 4B (0,-1)
(1,1)
(0,-2)
(0,3)
(0,4)
(0,-12)
(1,2)
(0,3)
(0,-31)
(0,22)
(0,-5)
(0,9)
(0,-38)
EOB(End Of Block)

Fig. 5

| R | L | Code number |
|---|---|---|
| - | 0(EOB) | 0 |
| 0 | 1 | 1 |
| 0 | -1 | 2 |
| 1 | 1 | 3 |
| 1 | -1 | 4 |
| 2 | 1 | 5 |
| 2 | -1 | 6 |
| 0 | 2 | 7 |
| 0 | -2 | 8 |
| 3 | 1 | 9 |
| 3 | -1 | 10 |
| 4 | 1 | 11 |
| 4 | -1 | 12 |
| 0 | 3 | 13 |
| 0 | -3 | 14 |
| 0 | 4 | 15 |
| 0 | -4 | 16 |
| ... | ... | ... |

Fig. 6

| Code number | VLC table 1 | VLC table 2 |
| --- | --- | --- |
| 0 | 1 | 100 |
| 1 | 010 | 101 |
| 2 | 011 | 110 |
| 3 | 00100 | 111 |
| 4 | 00101 | 01000 |
| 5 | 00110 | 01001 |
| 6 | 00111 | 01010 |
| 7 | 0001000 | 01011 |
| 8 | 0001001 | 01100 |
| 9 | 0001010 | 01101 |
| 10 | 0001011 | 01110 |
| 11 | 0001100 | 01111 |
| 12 | 0001101 | 0010000 |
| 13 | 0001110 | 0010001 |
| 14 | 0001111 | 0010010 |
| 15 | 000010000 | 0010011 |
| 16 | 000010001 | 0010100 |
| ... | ... | ... |

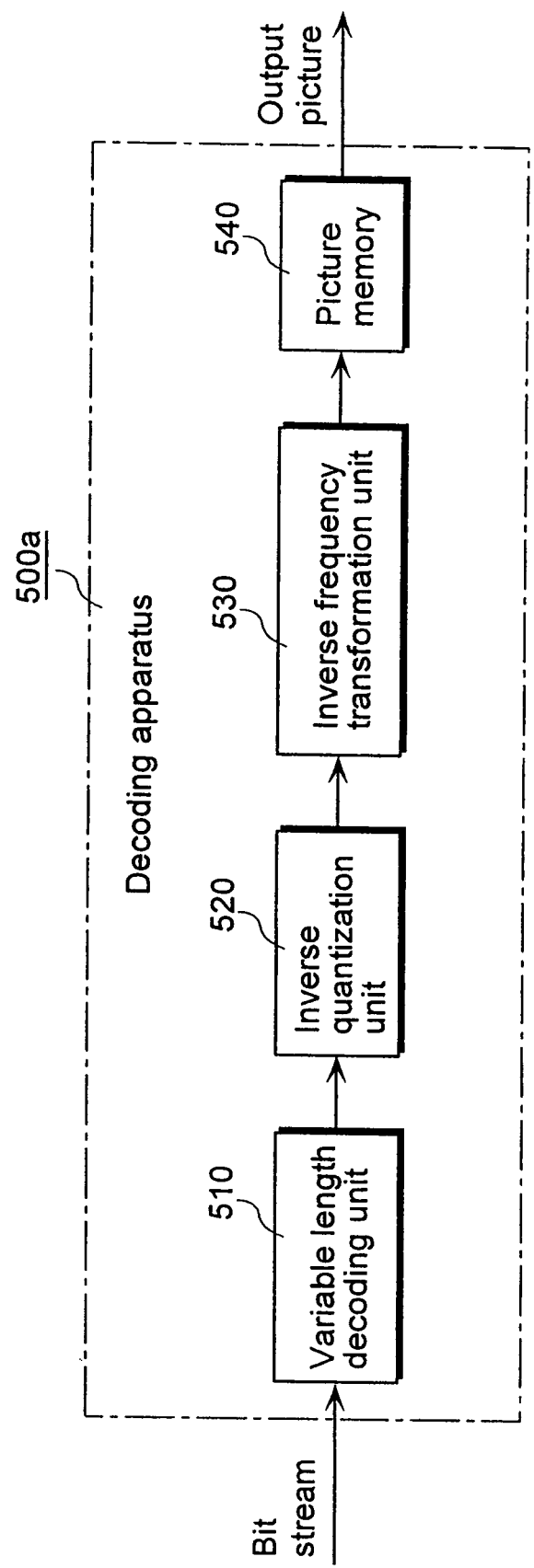

Fig. 10A (0,-1)
(1,1)
(0,-2)
(0,3)
(0,-4)
(0,-12)
(1,2)
(0,3)
(0,-31)
(0,22)
(0,-5)
(0,9)
(0,-38)
EOB(End Of Block)

Fig. 10B (0,-38)
(0,9)
(0,-5)
(0,22)
(0,-31)
(0,3)
(1,2)
(0,-12)
(0,4)
(0,3)
(0,-2)
(1,1)
(0,-1)
EOB(End Of Block)

|   |   |   |   |
|---|---|---|---|
| -38 | 9 | 7 | 0 |
| -5 | -31 | 2 | 0 |
| 22 | -12 | -2 | 0 |
| 6 | 3 | 0 | 0 |

Fig. 15B

| | | | |
|---|---|---|---|
| -38 → 9 | | 7 → 0 | |
| -5 | -31 | 2 | 0 |
| 22 | -12 | -2 | 0 |
| 6 → 3 | | 0 → 0 | |

| | | | | | |
|---|---|---|---|---|---|
| | 11 | | 11 | | |
| | (0,-38) | | (0,-2) | | -2 |
| | (0,9) | | (0,3) | | 3 |
| | (0,-5) | | (0,6) | | 6 |
| | (0,22) | | (0,-12) | | -12 |
| Fig. 16A | (0,-31) | Fig. 16B | (1,2) | Fig. 16C | 2 |
| | (0,7) | | (0,7) | | 7 |
| | (1,2) | | (0,-31) | | -31 |
| | (0,-12) | | (0,22) | | 22 |
| | (0,6) | | (0,-5) | | -5 |
| | (0,3) | | (0,9) | | 9 |
| | (0,-2) | | (0,-38) | | -38 |

Fig. 18

| Probability table 1 | [0.1:0.9] |
| --- | --- |
| Probability table 2 | [0.2:0.8] |
| Probability table 3 | [0.4:0.6] |
| Probability table 4 | [0.7:0.3] |

Fig. 21

| Absolute value of coefficient L | Binary data |
|---|---|
| 1 | 1 |
| 2 | 01 |
| 3 | 001 |
| 4 | 0001 |
| 5 | 00001 |
| 6 | 000001 |
| 7 | 0000001 |
| 8 | 00000001 |
| 9 | 000000001 |
| 10 | 0000000001 |
| ... | ... |

Fig. 24A

| Number of "L"'s | 13 | | | | | | | | | |
|---|---|---|---|---|---|---|---|---|---|---|
| \|L\| | 38 | 9 | 5 | 22 | 31 | 3 | 2 | 12 | 4 | 3 | 2 | 1 |
| Sign | 1 | 0 | 1 | 0 | 1 | 0 | 0 | 1 | 0 | 0 | 1 | 1 |

Fig. 24B

| R | 0 | 0 | 0 | 0 | 0 | 0 | 1 | 0 | 0 | 0 | 0 | 1 | 0 |

Fig. 25

| \|L\| | k=0 (1641a) | k=1 (1641b) | k=2 (1641c) | k=3 (1641d) | k=7 (1641g) |
|---|---|---|---|---|---|
| 1 | 1 | 10 | 100 | 1000 | 10000000 |
| 2 | 010 | 11 | 101 | 1001 | 10000001 |
| 3 | 011 | 0100 | 110 | 1010 | 10000010 |
| 4 | 00100 | 0101 | 111 | 1011 | 10000011 |
| 5 | 00101 | 0110 | 01000 | 1100 | 10000100 |
| 6 | 00110 | 0111 | 01001 | 1101 | 10000101 |
| 7 | 00111 | 001000 | 01010 | 1110 | 10000110 |
| 8 | 0001000 | 001001 | 01011 | 1111 | 10000111 |
| 9 | 0001001 | 001010 | 01100 | 010000 | 10001000 |
| 10 | 0001010 | 001011 | 01101 | 010001 | 10001001 |
| .. | .. | .. | .. | .. | .. |
| 25 | 000011001 | 00011010 | 0011100 | 0010000 | 10011000 |
| .. | .. | .. | .. | .. | .. |
| 49 | 00000110001 | 0000110010 | 000110100 | 00111000 | 10110000 |
| .. | .. | .. | .. | .. | .. |
| 97 | 0000001100001 | 000000110010 | 00000110100 | 0001101000 | 11100000 |
| .. | .. | .. | .. | .. | .. |
| 400 | 000000000110010000 | 00000000110010001 | 0000000110010011 | 000000110010111 | 001000001111 |

Fig. 26

| Threshold value for absolute value of coefficient |
|---|
| 4 |
| 7 |
| 13 |
| 25 |
| 49 |
| 97 |
| 193 |

Fig. 29

| Order starting from last | \|L\| | Table number for use | Threshold value | Variable length code (binary code) |
|---|---|---|---|---|
| 1 | 1 | k = 0 | 4 | 1 |
| 2 | 1 | k = 0 | 4 | 1 |
| 3 | 2 | k = 0 | 4 | 010 |
| 4 | 3 | k = 0 | 4 | 011 |
| 5 | 4 | k = 0 | 4 | 00100 |
| 6 | 12 | k = 0 | 4 | 0001100 |
| 7 | 2 | k = 1 | 7 | 11 |
| 8 | 3 | k = 1 | 7 | 0100 |
| 9 | 31 | k = 1 | 7 | 0000100000 |
| 10 | 22 | k = 2 | 13 | 0011001 |
| 11 | 5 | k = 3 | 25 | 1100 |
| 12 | 9 | k = 3 | 25 | 010000 |
| 13 | 38 | k = 3 | 25 | 00101101 | ns VARIABLE LENGTH CODING METHOD AND
VARIABLE LENGTH DECODING METHOD

This application is a divisional of application Ser. No. 10/478,185, filed date Nov. 19, 2003, now U.S. Pat. No. 7,305,035 which is the National Stage of International Application No. PCT/JP03/04803, filed Apr. 16, 2003.

TECHNICAL FIELD

The present invention relates to a variable length coding method for coding coefficients in each block which are obtained by performing frequency transformation on picture data of a moving picture per block having a predetermined size, as well as a variable length decoding method, and the like.

BACKGROUND ART

In coding a moving picture, compression of information volume is usually performed by utilizing redundancies both in spatial and temporal directions which the moving picture has. Usually, a transformation into a frequency domain is used as a method of utilizing the spatial redundancy while inter picture prediction coding is used as a method of utilizing the temporal redundancy.

In a moving picture coding method which is presently under the process of standardization, quantization is performed on each block sized 4×4 pixels so as to generate coefficients after frequency transformation is performed on such block, with the view to enhance coding efficiency of a conventional MPEG-4 moving picture coding method. Then, scanning is performed starting at direct current components toward high frequency components, and combinations of a value R (Run, to be simply referred to as "R" hereinafter) indicating the number of consecutive zero coefficients and a coefficient value L (Level, to be simply referred to as "L" hereinafter) subsequent to it are generated so that a combination sequence (R, L) is made. After transforming this (R, L) into a code number using a predetermined code table, coding is performed by transforming the code number into a VLC code, further using a single Variable Length Coding (VLC) table. In the code table, a smaller code number is usually assigned as an occurrence probability gets higher. For example, a small code number is assigned to a combination where both R and L indicate small values since its occurrence probability is high. In certain VLC code tables, a VLC code having a short code length is assigned to a small code number (see reference to ISO/IEC 14496-2: "Information technology—Coding of audio-visual objects—Part2: Visual" 7.4.1, pp. 119-120, 1999.12).

However, using the existing method engenders a decrease in coding efficiency since the code length gets longer as the number of consecutive zero coefficients R and a coefficient value L get larger. Usually, the decrease in coding efficiency is obvious when a low frequency component value is coded since the coefficient value L as a low frequency component value is large.

Namely, as a result of assigning a single VLC table according to the occurrence probability and a single unique variable length code according to a pair of R and L, the coefficient value L indicating a large value is transformed into a variable length code having a very long code length. Even when coding L separately from R (one-dimensional coding of L) using a single VLC table, the same problem occurs as in the case of coding R and L as a pair.

SUMMARY OF THE INVENTION

The present invention is conceived in view of the above problems, and aims to provide a variable length coding method and a variable length decoding method that can improve the coding efficiency when the coefficient value L is coded.

In order to achieve the above object, the variable length coding method according to the present invention codes coefficients in each block which are obtained by performing frequency transformation on picture data of a moving picture per block having a predetermined size, the method comprising: a coefficient scanning step of scanning the coefficients in each block in a predetermined order; and a coding step of coding the coefficients scanned in the coefficient scanning step into variable length codes in a predetermined order by switching between a plurality of tables to be used for coding.

Thus, it is possible to improve the coding efficiency since the variable length code of the code length based on the coefficient can be adapted to each table. In other words, it is possible to shorten a code length remarkably by switching between the tables depending on the coefficient so that a coefficient may be coded into a variable length code whose code length is shorter at one table than the other table when the coefficient is small and a coefficient may be coded into a variable length code whose code length is shorter at one table than the other when the coefficient is large.

Here, a direction of switching between the plurality of tables may be one-directional. Thus, the frequent switching of the tables is prevented and thereby the number of times switching between the tables decreases. It is therefore possible to enhance the coding efficiency. For example, since a work area in the memory is limited in space, only a table to be used is stored. In this case, it takes time to start coding the next coefficient since it takes time to read out the next table from the ROM and expand it in the work area each time the table is switched. Switching in this way one-directionally between the tables is effective in limiting the number of times switching between the tables and in reducing the total time necessary for coding the next coefficient.

In the coding step, the coding may be performed on each block by switching between the plurality of tables and the coefficients may be non-zero coefficients that are one-dimensionalized.

It is preferable that the coding is non-arithmetic coding. Thus, when a table to be used for coding is determined, the coding of coefficients into variable length codes can be performed by referring to the table.

It is also preferable that each of the tables has a different rate of change in code length for coefficients so that a code length for a smallest coefficient gets longer in an ascending order of numbers assigned respectively to each of the tables and a code length for a largest coefficient does not get longer in the same ascending order of the numbers. Also, it is also preferable that each of the tables is constructed so that a rate of increase in code length corresponding to an increase in coefficients gets smaller in an ascending order of numbers assigned to each of the tables. Thus, the improvement of the coding efficiency can be surely realized since a range in which a code length gets shorter at each table can be assigned.

Also, it is preferable that in the coding step, each of the tables is switched based on a predetermined threshold value for an absolute value of the coefficient. Thus, it is easy to judge a timing for switching between the tables and thereby the coding efficiency can be achieved.

It is also preferable that in the coefficient scanning step, the coefficients are scanned starting at high-frequency components toward low-frequency components. Since there is a great tendency that the absolute value of the coefficient gradually gets larger around "1", it is easy therefore to determine a table for coding the first coefficient in the block, a structure of each table and a threshold value.

Moreover, it is also preferable that in the coding step, a table used for coding a current coefficient to be coded is switched to a table whose number is larger than the number assigned to the table, when the absolute value of the current coefficient exceeds a threshold value. Thus, the coding efficiency can be enhanced since a code length can be shortened when the next coefficient is coded.

The variable length decoding method according to the present invention decodes variable length codes generated by coding coefficients in each block which are obtained by performing frequency transformation on picture data of a moving picture per block having a predetermined size, the method comprising: a decoding step of decoding the variable length codes in each block into coefficients in a predetermined order by switching between a plurality of tables to be used for decoding; and a coefficient generation step of generating coefficients in each block based on the coefficients generated in the decoding step. Thus, highly compression coded codes can be properly decoded.

Here, a direction of switching between the plurality of tables may be one-directional.

In the decoding step, the decoding may be performed on said each block by switching between the plurality of tables.

The coefficients may be non-zero coefficients that are one-dimensionalized.

The decoding may be non-arithmetic decoding.

Each of the tables may have a different rate of change in code length for coefficients so that a code length for a smallest coefficient value gets longer in an ascending order of numbers assigned respectively to each of the tables and a code length for a largest coefficient value does not get longer in the same ascending order of the numbers.

Each of the tables may be constructed so that a rate of increase in code length corresponding to an increase in coefficients gets smaller in an ascending order of numbers assigned respectively to each of the tables.

In the decoding step, each of the tables may be switched based on a predetermined threshold value for an absolute value of the coefficient.

In the coefficient generation step, the coefficients may be scanned in an order starting at high-frequency components toward low-frequency components according to an order in which a sequence of the coefficients is ranged.

Moreover, in the coding step, a following variable length code may be decoded by switching from a table used for decoding a current variable length code to be decoded to a table whose number is larger than the number assigned to said table, when an absolute value of the decoded coefficient exceeds a threshold value.

The present invention can be realized not only as a variable length coding method and a variable length decoding method, but also as a variable length coding apparatus and a variable length decoding apparatus having characteristic steps as units included in the variable length coding method and the variable length decoding method, as a moving picture coding method and a moving picture decoding method using the characteristic steps included in the variable length coding method and the variable length decoding method, and as a program having a computer execute these steps. Such program can be surely distributed via a recording medium such as a CD-ROM and a transmission medium such as an Internet.

BRIEF DESCRIPTION OF THE DRAWINGS

FIG. 2 is a block diagram showing in detail a functional structure of a variable length coding unit shown in FIG. 1.

FIGS. 3A and 3B are pattern diagrams for describing processing executed by an RL sequence generation unit shown in FIG. 2.

FIGS. 4A and 4B are pattern diagrams for describing an RL sequence generated by the RL sequence generation unit and reordering processing executed by a reordering unit shown in FIG. 2.

FIG. 5 is a diagram showing an example of a code table kept by a table storage unit shown in FIG. 2.

FIG. 6 is a diagram showing an example of a VLC table kept by the table storage unit shown in FIG. 2.

FIGS. 7A and 7B are pattern diagrams for describing another example of the RL sequence generated by the RL sequence generation unit and the reordering processing executed by the reordering unit.

FIG. 8 is a block diagram showing a functional structure of a decoding apparatus using a variable length decoding method and a moving picture decoding method according to a second embodiment of the present invention.

FIGS. 10A and 10B are pattern diagrams for describing an RL sequence generated by a code conversion unit shown in FIG. 9 and reordering processing executed by a reordering unit shown in FIG. 9.

FIGS. 12A and 12B are pattern diagrams for describing another example of the RL sequence generated by the code conversion unit and the reordering processing executed by the reordering unit.

FIGS. 15A and 15B are pattern diagrams showing schematically an RL sequence outputted from the RL sequence generation unit according to the third embodiment of the present invention.

FIGS. 16A, 16B and 16C are pattern diagrams showing schematically the RL sequence outputted by the RL sequence generation unit according to the third embodiment of the present invention.

FIG. 18 is a probability table contents display diagram showing the contents of a probability table according to the third embodiment of the present invention.

FIG. 21 is a table diagram showing an example of a binary table.

FIGS. 24A and 24B are diagrams showing an example of L sequence and R sequence generated by an RL sequence generation unit shown in FIG. 23.

FIG. 25 is a diagram showing a structural example for each VLC table stored in a storage unit shown in FIG. 23.

FIG. 26 is a diagram showing a structural example of a threshold value table stored in the storage unit shown in FIG. 23.

FIG. 29 is a pattern diagram showing how the code assignment unit performs coding processing.

DETAILED DESCRIPTION OF THE INVENTION

The following describes the embodiments according to the present invention with reference to the diagrams.

(First Embodiment)

Figure 1:
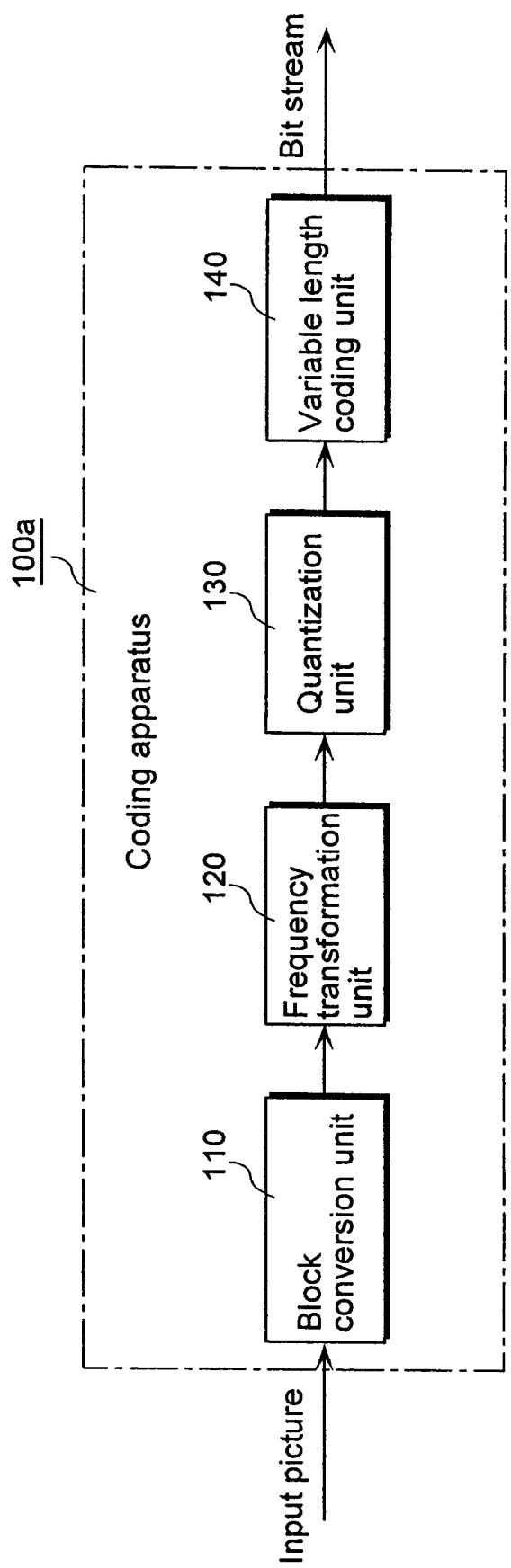
FIG. 1 is a block diagram showing a functional structure of a coding apparatus using a variable length coding method and a moving picture coding method according to a first embodiment of the present invention.

FIG. 1 is a block diagram showing a functional structure of a coding apparatus to which the moving picture coding method according to the present invention 59 is applied. The first embodiment illustrates the functional structure in a case of intra-picture coding an input picture using the moving picture coding method according to the present invention.

As shown in the diagram, a coding apparatus 100a is comprised of a block conversion unit 110, a frequency transformation unit 120, a quantization unit 130 and a variable length coding unit 140. Each unit composing such coding apparatus 100a is realized with a CPU, a ROM for storing in advance a program or data executed by the CPU and a memory for providing a work area when the program is executed as well as for storing temporally the input picture, or the like.

The block conversion unit 110 divides the input picture into blocks, each of which is sized 4 (horizontal)×4 (vertical) pixels and outputs each pixel block to the frequency transformation unit 120.

The frequency transformation unit 120 performs frequency transformation on the inputted pixel blocks and converts them into frequency coefficients and then outputs the transformed frequency coefficients to the quantization unit 130.

The quantization unit 130 performs quantization processing on the inputted frequency coefficients. The quantization processing here means processing equivalent to dividing a frequency coefficient by a predetermined quantization value. Moreover, a quantization value varies depending generally on a pixel block and a frequency band. The quantized frequency coefficients are inputted to the variable length coding unit 140.

The variable length coding unit 140 performs variable length coding on values of the frequency coefficients in the block whose size is predetermined (4×4 pixels).

FIG. 2 is a block diagram showing in detail a functional structure of the variable length coding unit 140.

The variable length coding unit 140 includes an RL sequence generation unit 141, a reordering unit 142, a code assignment unit 143 and a table storage unit 144.

The quantized frequency coefficients outputted from the quantization unit 130 are inputted to the RL sequence generation unit 141.

The RL sequence generation unit 141 first converts the quantized frequency coefficients into one-dimensionalized coefficients, using a predetermined scanning method. The RL sequence generation unit 141 then generates a sequence (to be referred to as "RL sequence" hereinafter) made up of a combination of a value R indicating the number of consecutive zero coefficients and a non-zero coefficient value L subsequent to it, (to be referred to as "RL value" hereinafter). An example of this is explained with reference to FIGS. 3 and 4.

FIG. 3A is a diagram showing the quantized frequency coefficients in a block, outputted from the quantization unit 130. Here, the upper left frequency coefficient denotes a direct-current component, and frequency components in the horizontal direction become larger toward right, while frequency components in the vertical direction become larger downward. FIG. 3B is a diagram showing a scanning method for one-dimensionalizing the quantized frequency coefficients. The RL sequence generation unit 141 one-dimensionalizes the coefficients by performing scanning starting at the low-frequency domain toward the high-frequency domain.

A result of generating an RL sequence for the one-dimensionalized coefficient values, performed by the RL sequence generation unit 141, is shown in FIG. 4A. In FIG. 4A, EOB (End Of Block) is an identifier indicating that all the subsequent coefficient values in the block are "0". Generally, a coefficient value is more likely to be "0" in the high-frequency domain. Therefore, by performing scanning starting at the low-frequency domain toward the high-frequency domain, it is possible to reduce the amount of information included in the RL sequence. The generated RL sequence is inputted to the reordering unit 142.

The reordering unit 142 sorts the inputted RL sequence in reverse order. However, the EOB shall not be reordered. The FIG. 4B shows a status after the reordering is performed. The RL sequence thus reordered is inputted to the code assignment unit 143.

The table storage unit 144 keeps in advance a table (a code table, see reference to FIG. 5) correlating RL values with code numbers assigned to the RL values as well as a plural kinds of tables (VLC tables in FIG. 6) correlating code numbers with variable length codes, and the like.

The code assignment unit 143 assigns the variable length codes to each pair in the RL sequence using the tables stored in the table storage unit 144.

To be more precise, the code assignment unit 143 firstly assigns the code numbers to the RL values. Here, the conversion of the RL values into the code numbers is operated using a predetermined code table (see reference to FIG. 5) stored in the table storage unit 144.

FIG. 5 is a diagram showing an example of the code table.

The code table is constructed making use of a tendency that the smaller code numbers are usually assigned as the probability of the RL values become larger and the probability increases as the RL values indicate the smaller values. With the use of this table, for example, the code number "2" is assigned to the first RL value (0, −1). For the second to fifth RL values (1, 1), (0, −2), (0, 3) and (0, 4), the code numbers "3", "8", "13" and "15" are assigned respectively.

Then, the code assignment unit 143 converts the code numbers into the variable length codes. For the conversion of the code numbers into the variable length codes, a plurality of VLC tables (see reference to FIG. 6) stored in the table storage unit 144 are used.

FIG. 6 is a diagram showing an example of the VLC table.

In the first embodiment, two kinds of VLC tables are stored.

The first VLC table 1 and the second VLC table 2 are constructed so that the variable length code becomes longer as the code number becomes larger. The VLC table 1 is constructed so that the variable length code becomes shorter as the code number gets smaller, compared to the VLC table 2, whereas the VLC table 2 is constructed so that the variable length code becomes shorter as the code number gets larger, compared to the VLC table 1. Namely, a short code is assigned to a small code number in the VLC table 1 and a short code is assigned to a large code number in the VLC table 2.

The VLC table 1 is used for the first RL value. In this case, the code number for the first RL value is "2", therefore, the variable length code is "011". The conversion of the code numbers into the variable length codes is performed subsequently, and when an absolute value of L exceeds a threshold value, the VLC table 2 is used for the following RL values. Assume that a threshold value of the absolute value of L is "2", the absolute value of L exceeds the threshold value at the fourth RL value (0, 3). Therefore, the VLC table 1 is used for the first through the fourth RL values and the VLC table 2 is used for the fifth RL value and thereafter.

Here, the absolute value of L again goes below the threshold value at the seventh RL value (1, 2), however, the table is not switched to the VLC table 1, and the VLC table 2 is used for the conversion. This means that a direction of switching between the tables is one-directional. Here, "one-directional" means that the table once used is not to be used again. Thus, the frequent switching of the tables is prevented and thereby the number of times switching between the tables decreases. The absolute value of L generally tends to increase when the coefficients are one-dimensionalized starting at high-frequency components toward the low-frequency components. Therefore, in many cases, once the absolute value of L goes beyond the threshold value, it is only the coefficient that goes below the threshold value even the absolute value of L again goes below the threshold value. It is therefore possible to improve coding efficiency by not using again the used tables even when the absolute value of L again goes below the threshold value. For example, usually, only the table to be used next is stored in a work area since the work area in the memory is limited in space. In this case, it takes time until the next coefficient starts being coded since it takes time to read out the next table from the ROM and expand it in the work area each time the table is switched. In this way, switching one-directionally between the tables is effective in limiting the number of times switching between the tables and in abbreviating a total time necessary to start coding the next coefficient.

The RL sequence generation unit 141 performs scanning on coefficient values in a coefficient value sequence starting at the low-frequency components toward the high-frequency components whereas the code assignment unit 143 subsequently performs variable length coding starting from the end of the coefficient value sequence. This facilitates quick decisions on a table to be used for coding the first coefficient value in the block, a structure of each table and a threshold value, since the absolute value of the coefficient tends to become larger around "1".

Thus, the variable length coding method according to the first embodiment performs scanning on the frequency coefficients in the block, starting at the low-frequency domain toward the high-frequency domain. Then, a sequence of RL values, each of which is a combination of a value R indicating the number of consecutive zero coefficients and a coefficient value L indicating a non-zero coefficient is generated for the one-dimensionalized coefficients. The RL values are converted into the variable length codes in an order reverse to the order for scanning. Namely, the RL values may be converted directly. A plurality of VLC tables are prepared for converting the RL values into the variable length codes. Firstly, the first VLC table is used for the conversion, and when the absolute value of L exceeds the threshold value, the second VLC table is used for the subsequent RL values. Here, in the first VLC table, the variable length code gets shorter as the code number becomes smaller, compared to the second VLC table, and in the second VLC table, the variable length code gets shorter as the code number becomes larger, compared to the first VLC table.

The absolute value of L usually becomes larger in the low-frequency domain, therefore, the absolute value of L become larger when the RL values are converted into the variable length codes in an order reverse to the order in which the RL values are generated by scanning the coefficients from the low-frequency domain toward the high-frequency domain.

Therefore, when the absolute value of L gets larger after the absolute value of L has exceeded the threshold value, that is, by using the VLC table in which the variable length code becomes shorter as the code number gets larger, the total amount of code can be reduced. Namely, the total code amount for L can be reduced also by coding L and R separately, and also, by using plural VLC tables.

The first embodiment describes the case of coding the picture using intra-picture coding, however, the same effects can be obtained for the case in which a picture is coded by means of inter-picture coding by performing motion compensation and others on an input moving picture, using the method according to the present embodiment.

Also, the first embodiment describes the case of dividing the input picture into a block with the size of 4 (horizontal)×4 (vertical) pixels, however, a different size can be given for the size of the block.

The first embodiment describes a method of scanning a block with reference to FIG. 3, however, other scanning method can be employed providing that the scanning is performed starting at the low-frequency domain toward the high-frequency domain.

Also, an example of the code table is described with reference to FIG. 5, however, it may be a different code table.

Similarly, an example of the VLC table is described with reference to FIG. 6, however, it may be a different table.

The case of using two VLC tables is described in the present embodiment, however, three VLC tables can be used with the use of plural threshold values and the VLC tables may be switched each time each threshold value is exceeded.

In the first embodiment, it is explained that the VLC tables are switched when the absolute value of L has exceeded the threshold value, however, the same effects can be obtained in switching between the VLC tables when the code number has exceeded the threshold value.

It is also described in the present embodiment that the EOB is added to the end of the RL sequence, however, the number of the RL values may be added to the head of the RL sequence. FIGS. 7A and 7B show the number of RL values to be coded and the RL sequence, corresponding to FIGS. 4A and 4B for this case.

In the code table shown in FIG. 5, the assignment of the code number to the EOB is unnecessary.

(Second Embodiment)

FIG. 8 is a block diagram showing a functional structure of a decoding apparatus to which the variable length decoding method according to the embodiments of the present invention is applied. Here, the bit stream generated using the variable length coding method according to the present invention described in the first embodiment shall be inputted.

As shown in FIG. 8, a decoding apparatus 500a is comprised of a variable length decoding unit 510, an inverse quantization unit 520, an inverse frequency transformation unit 530 and a picture memory 540. Each unit composing such decoding apparatus 500a, like the coding apparatus 100a, is realized with a CPU, a ROM for storing in advance a program or data executed by the CPU and a memory for providing a work area when the program is executed as well as for storing temporally the input picture, or the like.

The bit stream is inputted to the variable length decoding unit 510. The variable length decoding unit 510 decodes the bit stream that is variable length coded. The bit stream is generated by dividing the picture data into blocks, each of which has a predetermined size, one-dimensionalizing the frequency coefficients in the block using a predetermined scanning method and coding a sequence of the combinations (RL values) of the value R indicating the number of consecutive zero coefficients and the coefficient value L subsequent to it.

Figure 9:
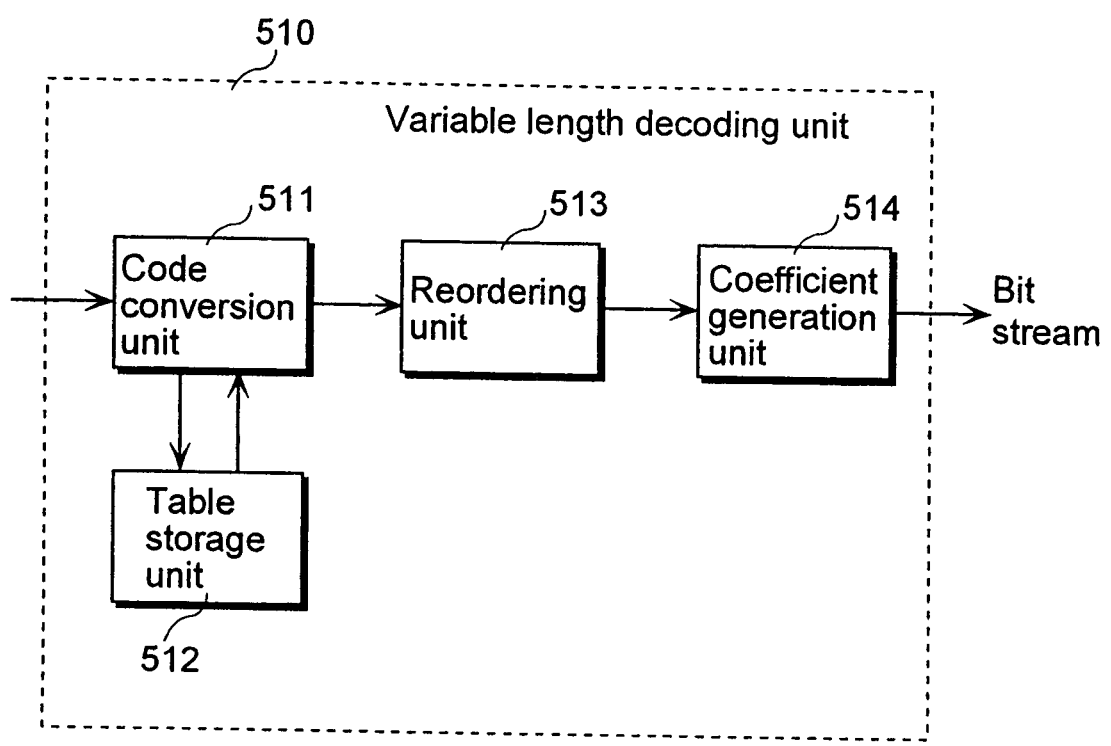
FIG. 9 is a block diagram showing in detail a functional structure of a variable length decoding unit shown in FIG. 8.

FIG. 9 is a block diagram showing in detail a functional structure of the variable length decoding unit 510.

As shown in FIG. 9, the variable length decoding unit 510 includes a code conversion unit 511, a table storage unit 512, a reordering unit 513 and a coefficient generation unit 514.

The table storage unit 512 is constructed in the same manner as the table storage unit 144 and stores in advance plural kinds of tables (VLC tables in FIG. 6) correlating the code numbers with the variable length codes and the table (a code table, see reference to FIG. 5) correlating the RL values with the code numbers assigned to them.

The code conversion unit 511 converts variable length code into code numbers for the inputted bit stream using the tables (plural VLC tables) stored in the table storage unit 512. The conversion of the variable length codes into the code numbers is performed using a plurality of VLC tables. The VLC tables are stored in the table storage unit 512 and the variable length codes are converted into the code numbers by referring to the table storage unit 512.

An example of the VLC table is explained with reference to FIG. 6. Here, two types of VLC tables are stored. A shorter code is assigned to a smaller code number in the VLC table 1 whereas a shorter code is assigned to a larger code number in the VLC table 2. Assume that a code of a head part of the inputted bit stream is "01100100000100100011100010011" here. The VLC table 1 is used for the first variable length code. When the VLC table 1 in FIG. 6 is referred to, the variable length code "011" corresponds to the inputted bit stream, therefore, the code number is "2" in this case.

The code conversion unit 511 then converts the obtained code number to an RL value. In this case, a predetermined code table is used. The code table is stored in the table storage unit 512, and the code number is converted into an RL value with reference to the table storage unit 512. An example of the code table is shown in FIG. 5. The code number, in this case, is "2", therefore, the RL value is (0, −1).

Similarly, in sequentially proceeding the conversion of the variable length codes into the code numbers one by one using the VLC table 1, the variable length code "00100" is converted to the code number "3", the variable length code "0001001" to the code number "8" and the variable length code "0001110" to the code number "13" respectively and the respective code numbers are further converted to the RL values (1, 1), (0, −2) and (0, 3).

Here, when the absolute value of L of the obtained RL value, exceeds the threshold value, the code conversion unit 511 uses the VLC table 2 for the conversion of the subsequent variable length codes. Assume that the threshold value of the absolute value of L is "2", the absolute value of L goes beyond the threshold value at the fourth RL value (0, 3). Therefore, for the subsequent RL values, the conversion is operated using the VLC table 2. Consequently, the next variable length code "0010011" is converted to the code number "15" and further converted to the RL value (0, 4).

Even when the absolute value L of the RL value obtained in the subsequent decoding, goes below the threshold value again, the switching to the VLC table 1 is not operated, and the VLC table 2 is used for the conversion. Thus, when the RL values equivalent to a single block are generated (an EOB is detected), they are inputted to the reordering unit 513. Here, it is assumed that the RL sequence shown in FIG. 10A is generated.

The reordering unit 513 sorts the inputted RL sequence in reverse order. However, the EOB shall not be reordered. FIG. 10B shows the status after the reordering. The RL sequence thus reordered is inputted to the coefficient generation unit 514.

The coefficient generation unit 514 converts the inputted RL sequence into coefficients and two-dimensionalizes a coefficient block using a predetermined scanning method. When the RL sequence is converted into the coefficients, a coefficient "0" is generated for the number indicated by R based on the predetermined scanning order, and then the coefficient indicated by L is generated. Here, assuming that the coefficients are scanned in zigzags starting at the low-frequency domain toward the high-frequency domain, the RL sequence shown in FIG. 10B is converted into the coefficient block shown in FIG. 11. The generated coefficient block is inputted to the inverse quantization unit 520.

The inverse quantization unit 520 performs inverse quantization processing on the inputted coefficient block. The inverse quantization here means to integrate a predetermined quantization value to each coefficient in the coefficient block. The quantized value here depends usually on a block or a frequency band using either a value obtained from the bit stream or a predetermined value. The inverse quantized coefficient block is inputted to the inverse frequency transformation unit 530.

The inverse frequency transformation unit 530 performs inverse frequency transformation on other inverse quantized coefficient blocks so as to convert them into pixel blocks. The converted pixel blocks are inputted to the picture memory 540.

The decoded pixel blocks are stored one by one in the picture memory 540, and outputted as an output picture after the pixel blocks equivalent to a single picture are stored.

Thus, the variable length decoding method according to the present invention decodes an input bit stream firstly by using the first VLC table and generates a sequence of RL values which is a combination of R indicating the number of consecutive zero coefficients and L indicating a non-zero coefficient subsequent to it. Then, when the absolute value of L exceeds the threshold value, the second VLC table is used for decoding the subsequent variable length codes. The RL value is then converted into a coefficient based on a predetermined method of scanning the block after the RL values are put in reverse order.

With the above processing, it is possible to decode properly the bit stream that is coded using the variable length coding method according to the present invention by using the variable length decoding method of the present invention.

In the second embodiment, the case of decoding the bit stream generated using intra-picture coding is explained, however, the same effects can be obtained in a case of decoding the bit stream generated by performing inter-picture coding on an input moving picture, with the use of motion compensation and others, employing the method according to the present embodiment.

The second embodiment describes the case in which the input picture is divided into blocks, each of which is sized 4 (horizontal)×4 (vertical) pixels and coded, however, a different size can be given for the size of the block.

Figure 11:
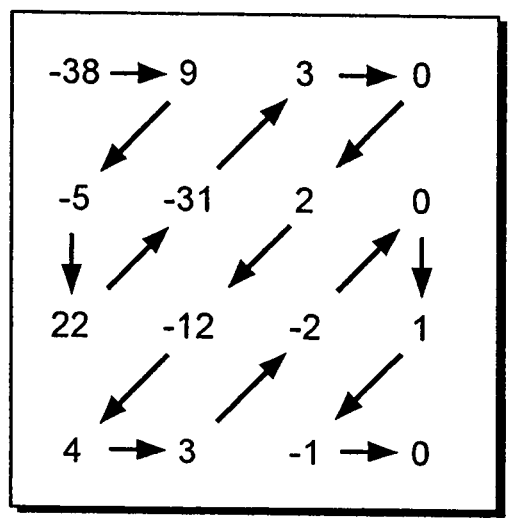
FIG. 11 is a pattern diagram for describing processing executed by a coefficient generation unit shown in FIG. 9.

Also, the second embodiment describes a method of scanning a block with reference to FIG. 11, however, different scanning order may be used providing that it is the one used for coding.

In the second embodiment, the example of the code table is explained with reference to FIG. 11, however, a different code table can be used providing that it is the one used for coding.

Also, an example of the VLC table is explained with reference to FIG. 6, however, a different table can be used providing that it is the one used for coding. The case of using two VLC tables is described in the present embodiment, however, three VLC tables may be used with the use of plural threshold values, and the VLC table can be switched each time each threshold value is exceeded. However, the structure of the VLC table and the threshold value shall be the same as those used for coding.

The second embodiment also describes the case of switching between the VLC tables when the absolute value of L has exceeded the threshold value, however, the same effects can be obtained in switching between the VLC tables when the code number has exceeded the threshold value.

The case of decoding the bit stream coded with the EOP attached to the end of the RL sequence is described in the second embodiment, however, the bit stream that is coded with the number of RL values attached to the head of the RL sequence may be decoded. FIGS. 12A and 12B show the number of RL values and the RL sequence obtained from the decoding processing, corresponding to FIGS. 10A and 10B for this case. In this case, in the code table shown in FIG. 5, the assignment of the code number to the EOB is unnecessary.

The variable length coding method according to the present invention performs scanning on the frequency coefficients in the block starting at the low-frequency domain toward the high-frequency domain and one-dimensionalizes them. Then, a sequence of RL values, each of which is a combination of R, the number of consecutive zero coefficients, and L, the non-zero coefficient subsequent to it, is generated for the one-dimensionalized coefficients. The RL values are then converted into variable length codes in an order reverse to the order of scanning. A plurality of VLC tables are prepared for converting the RL values into the variable length codes. Then, the conversion is made firstly by using the first VLC table, and when the absolute value of L or the code number exceeds the threshold value, the second VLC table is used for converting the subsequent RL values. In this case, in the first VLC table, the variable length code becomes shorter as the code number gets smaller, compared to the second VLC table, and in the second VLC table, the variable length code becomes shorter as the code number gets larger, compared to the first VLC table.

Usually, the absolute value of L and the code number become larger in the low-frequency domain, therefore, the absolute value of L gets larger when the RL values are converted into the variable length codes in an order reverse to the order in which the RL values are generated by performing scanning starting at the low-frequency domain toward the high-frequency domain. Therefore, the total code amount can be reduced by using the VLC table in which the variable length code gets shorter as the code number becomes larger, after the absolute value of L has exceeded the threshold value.

The variable length decoding method according to the present invention decodes firstly the input bit stream using the first VLC table and generates a sequence of the RL values, each of which is a combination of R, the number of consecutive zero coefficients, and L, the non-zero coefficient that follows it. When the absolute value of L or the code number exceeds the threshold value, the second VLC table is used for decoding the subsequent variable length codes. The RL values are then converted to the coefficients based on the predetermined order of scanning the block, after the RL values are put in reverse order.

With the above processing, it is possible, by using the variable length decoding method according to the present invention, to decode properly the bit stream that is coded using the variable length coding method according to the present invention.

(Third Embodiment)

The following describes a coding apparatus according to the third embodiment with reference to the diagrams.

Figure 13:
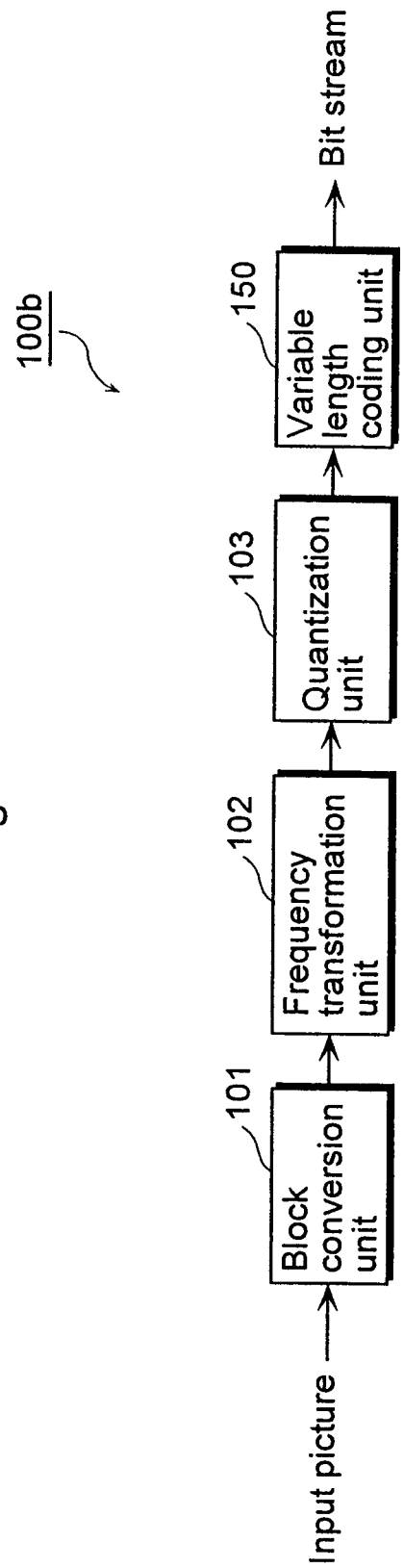
FIG. 13 is a block diagram showing a structure of a coding apparatus according to a third embodiment of the present invention.

FIG. 13 is a block diagram showing a structure of the coding apparatus 100*b* according to the third embodiment of the present invention.

This picture coding apparatus 100*b*, which performs intra-picture coding on an input picture (picture data) with improved coding efficiency, is comprised of a block conversion unit 101, a frequency transformation unit 102, a quantization unit 103, and a variable length coding unit 150.

The block conversion unit 101 divides the input picture into pixel blocks, each of which has a size of 4 (horizontal)×4 (vertical) pixels, and outputs them to the frequency transformation unit 102.

The frequency transformation unit 102 performs frequency transformation on each of the divided pixel blocks so as to generate frequency coefficients. Then, the frequency transformation unit 102 outputs the generated frequency coefficients to the quantization unit 103.

The quantization unit 103 performs quantization on the frequency coefficients outputted by the frequency transformation unit 102. The quantization here means processing equivalent to dividing a frequency coefficient by a predetermined quantization value. Moreover, a quantization value varies depending generally on a pixel block and a frequency band. Subsequently, the quantization unit 103 outputs the quantized frequency coefficients to the variable length coding unit 150.

The variable length coding unit 150 performs variable length coding on the frequency coefficients quantized by the quantization unit 103.

Figure 14:
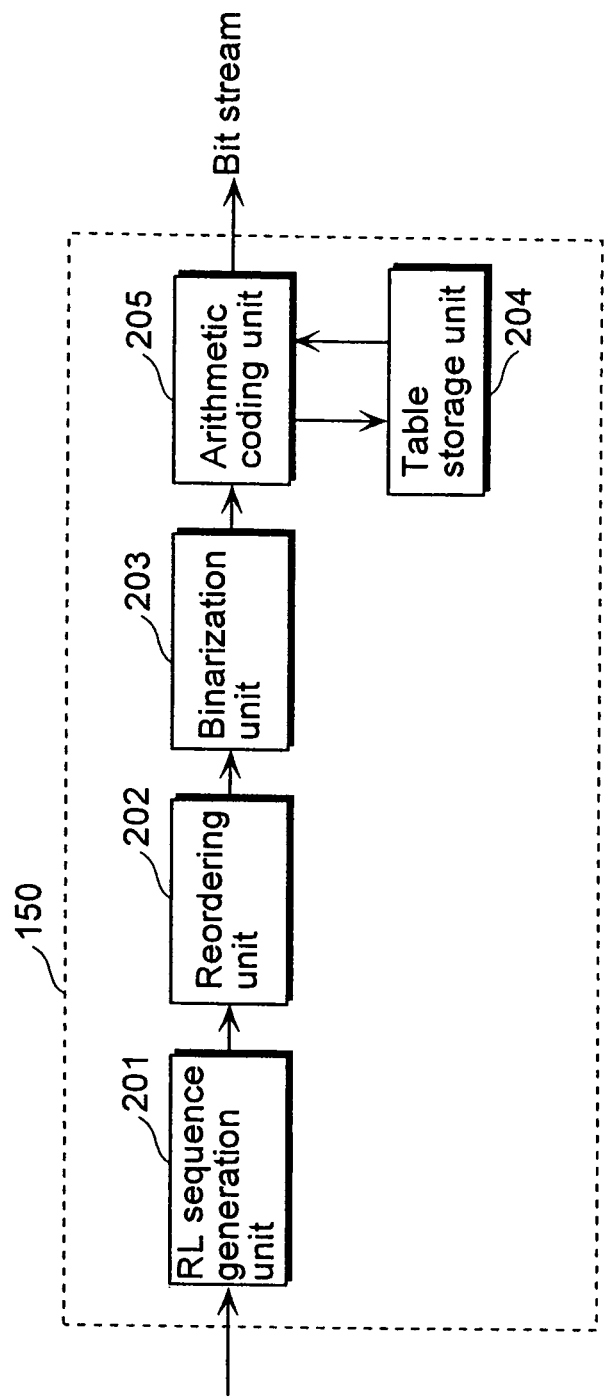
FIG. 14 is a block diagram showing an internal structure of the variable length coding unit according to the third embodiment of the present invention.

FIG. 14 is a block diagram showing an internal structure of the variable length coding unit 150.

As shown in FIG. 14, the variable length coding unit 150 is made up of an RL sequence generation unit 201, a reordering unit 202, a binarization unit 203, a table storage unit 204, and an arithmetic coding unit 205.

The RL sequence generation unit 201 converts the quantized frequency coefficients (to be abbreviated as "coefficients" hereinafter) outputted by the quantization unit 103 into one-dimensionalized coefficients, using a predetermined scanning method. Then, the RL sequence generation unit 201 generates a sequence (to be referred to as "RL sequence" hereinafter) made up of combinations of a value R indicating the number of consecutive zero coefficients and a coefficient value L indicating a non-zero coefficient (to be referred to as "RL values" hereinafter). An example of this is described with reference to FIGS. 15 and 16.

FIG. 15A shows a coefficient block made up of a plurality of coefficients outputted by the quantization unit 103. Here, the upper left frequency coefficient denotes a direct-current component, and frequency components in the horizontal direction become larger toward right, while frequency components in the vertical direction become larger downward.

FIG. 15B is an explanation diagram for explaining a scanning method for one-dimensionalizing a plurality of coefficients in a coefficient block. As indicated by arrows in FIG. 15B, the RL sequence generation unit 201 one-dimensionalizes the coefficients by performing scanning in the coefficient block starting at the low-frequency domain toward the high-frequency domain.

FIG. 16A shows an RL sequence outputted by the RL sequence generation unit 201. In FIG. 16A, the first number indicates the number of coefficients. Generally, a coefficient value is more likely to be "0" in the high-frequency domain. Therefore, by performing scanning starting at the low-frequency domain toward the high-frequency domain, it is possible to reduce the amount of information included in an RL sequence (of which, the amount of information of the numbers R). The generated RL sequence is inputted to the reordering unit 202.

The reordering unit 202 sorts the inputted RL sequence in reverse order. However, the number of coefficients shall not be reordered.

FIG. 16B shows the RL sequence reordered by the reordering unit 202. By performing reordering in this way, it is possible to reduce the amount of information as described above, and consequently to one-dimensionalize coefficients by applying scanning to the coefficient block from the high-frequency domain toward the low-frequency domain. Subsequently, the RL sequence thus reordered is outputted to the binarization unit 203.

The binarization unit 203 performs binarization on the number of coefficients and each RL value, i.e. converts them into binary data made up of "0"s and "1"s. Here, the value R and the coefficient value L are binarized separately.

FIG. 16C shows only the coefficient values L in the RL sequence reordered by the reordering unit 202. The absolute values and signs of these coefficient values L are separately processed. Moreover, the binarization unit 203 performs binarization on the values R and the absolute values of the coefficient values L, using a predetermined binary table as shown in FIG. 21, for example. Then, the binary unit 203 outputs, to the arithmetic coding unit 205, binary data resulted from performing binarization on them.

The arithmetic coding unit 205 performs binary arithmetic coding on the values of the numbers R and the absolute values of the coefficient values L represented as binary data, while coding the signs of the coefficient values L at the same time. An explanation is given here for the arithmetic coding to be performed on the absolute value of the coefficient value L. The arithmetic coding unit 205 uses a plurality of probability tables by switching between them, when performing arithmetic coding on the absolute value of the coefficient value L represented as binary data. The plurality of probability tables are stored in the table storage unit 204.

Figure 17:
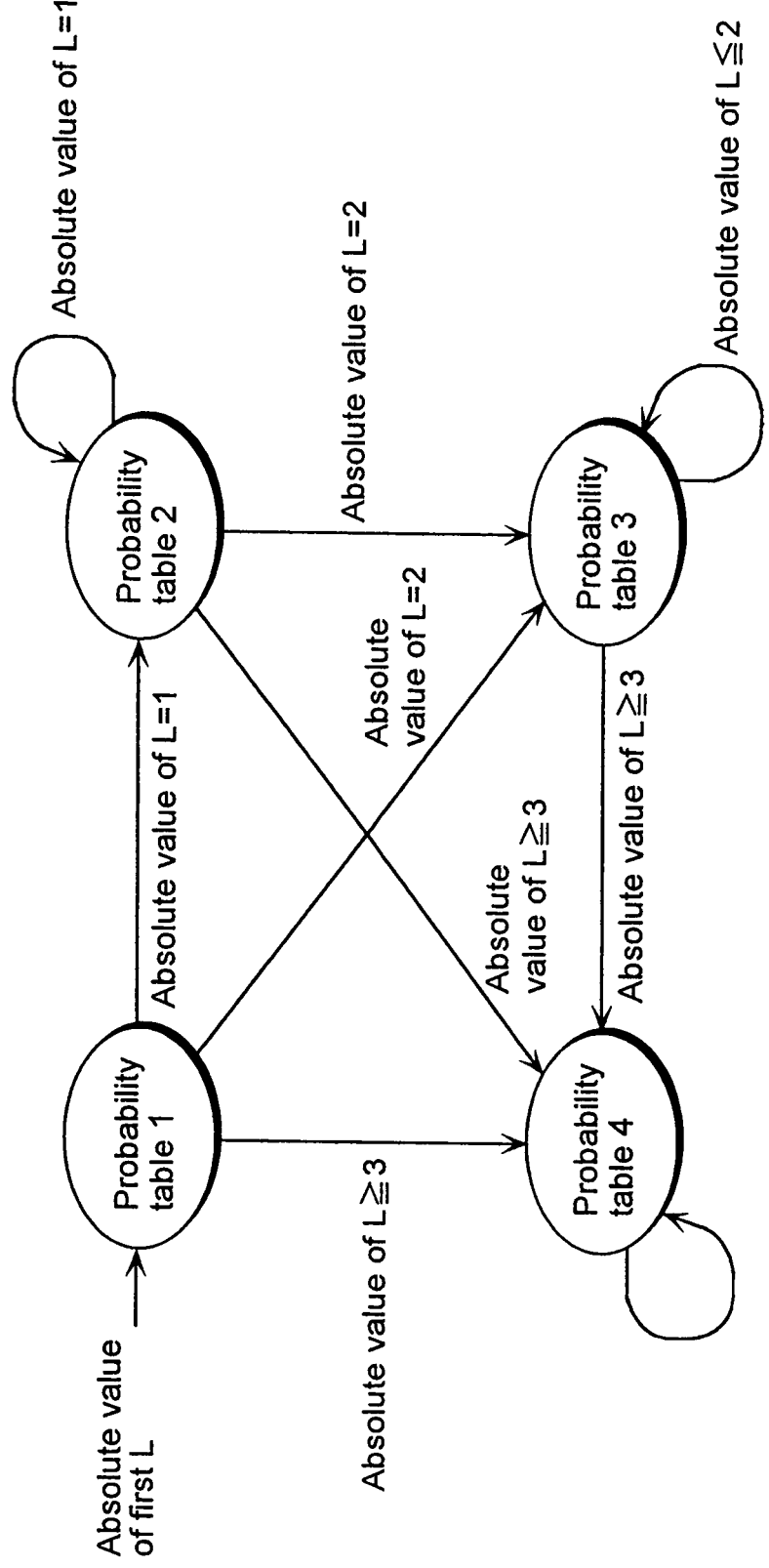
FIG. 17 is a transition diagram showing a method of switching between probability tables according to the third embodiment of the present invention.

FIG. 17 is a transition diagram showing a method of switching between the probability tables.

As FIG. 17 shows, the arithmetic coding unit 205 uses four probability tables, out of which the probability table 1 is used to perform arithmetic coding on the absolute value of the first coefficient value L. Meanwhile, for the subsequent coefficient values L, the arithmetic coding unit 205 switches to another probability table for use, depending on the table number of the probability table used for coding the absolute value of the previous coefficient value L as well as on the absolute value. Here, four probability tables are the probability table 1, the probability table 2, the probability table 3, and the probability table 4, and the table number of the probability table 1 is "1", the table number of the probability table 2 is "2", the table number of the probability table 3 is "3", and the table number of the probability table 4 is "4".

More specifically, the probability table 2 is used when one of the followings is satisfied: when the probability table 1 is used to code the absolute value of the previous coefficient value L and its absolute value is "1"; and when the probability table 2 is used to code the absolute value of the previous coefficient value L and its absolute value is "1". Meanwhile, the probability table 3 is used when one of the followings is satisfied: when the probability table 1 is used to code the absolute value of the previous coefficient value L and its absolute value is "2"; when the probability table 2 is used to code the absolute value of the previous coefficient value L and its absolute value is "2"; and when the probability table 3 is used to code the absolute value of the previous coefficient value L and its absolute value is "2 or smaller". And, the probability table 4 is used when one of the followings is satisfied: when the absolute value of the previous coefficient value L is "3 or larger"; and when the probability table 4 is used to code the absolute value of the previous coefficient value L.

As described above, the probability tables are switched in one direction, that is, from a probability table with a smaller table number to a probability table with a larger table number. Accordingly, even when the absolute value of the previous coefficient value L is equal to or smaller than a predetermined threshold value, the probability tables shall not be switched back in the opposite direction. This is the point that distinguishes the present invention from the existing technique.

FIG. 18 is a probability table contents display diagram showing the contents of the aforementioned four probability tables 1~4.

As shown in FIG. 18, each of the four probability tables 1~4 is made up of the probability with which "0" occurs and the probability with which "1" occurs.

For example, the probability table 1 is made up of the probability "0.1" with which "0" occurs and the probability "0.9" with which "1" occurs, and the probability table 2 is made up of the probability "0.2" with which "0" occurs and the probability "0.8" with which "1" occurs.

To put it another way, when the absolute value of the coefficient value L is "2", the result of binarizing "2" is "01", and therefore, when using the probability table 1 to perform arithmetic coding on "01", the arithmetic coding unit 205 performs arithmetic coding on "01" using the probability "0.1" corresponding to "0" in such "01" and the probability "0.9" corresponding to "1" in such "01".

Here, since the sum of the probability with which "0" occurs and the probability with which "1" occurs is 1.0, it is not necessary to hold both of these probabilities, and therefore only either of the probabilities may be retained.

The following explains an example of switching between probability tables in a case where coding is performed on the absolute values (binarized ones) of the coefficient values L shown in FIG. 16C.

The arithmetic coding unit 205 uses the probability table 1 for the absolute value of the first coefficient value L (−2). Here, since the absolute value of such coefficient value L is 2, the arithmetic coding unit 205 switches the probability table 1 to the probability table 3 for use. Accordingly, the arithmetic coding unit 205 uses the probability table 3 to perform arithmetic coding on the absolute value of the second coefficient value L (3). Here, since the absolute value of such coefficient value L is "3", the arithmetic coding unit 205 switches the probability table 3 to the probability table 4 for use. Accordingly, the arithmetic coding unit 205 uses the probability table 4 to perform arithmetic coding on the absolute value of the third coefficient value L (6). Here, since the probability table to be used has been switched to the probability table 4, the arithmetic coding unit 205 uses the probability table 4 to perform arithmetic coding on the absolute values of all the subsequent coefficient values L. For example, the absolute value of the fifth coefficient value L is "2", but unlike the existing technique, the arithmetic coding unit 205 uses the probability table 4 when performing arithmetic coding on the absolute value of the sixth coefficient value L and thereafter, without switching to another probability table.

Furthermore, since each of the probability tables are updated as needed depending on whether an input is "0", or "1", such probability tables are updated to be adapt to the input.

As described above, in the variable length coding method employed by the variable length coding unit 150 in the picture coding apparatus 100b according to the present invention, one-dimensionalization is performed on coefficients within a coefficient block by scanning them starting at the low-frequency domain toward the high-frequency domain. Then, it generates a sequence of RL values (RL sequence) made up of a combination of a number R indicating consecutive zero coefficient values and a non-zero coefficient value L subsequent to it. Such RL values are then converted into variable length codes in an order opposite to the one in which the scanning has been applied. When the RL values are converted into variable length codes, numbers R, the absolute values of coefficient values L and the signs of the coefficient values L are converted separately. When they are converted, binarization is performed first, which is followed by arithmetic coding. In order to perform arithmetic coding on the absolute values of the coefficient values L, a plurality of probability tables are switched between them. When a probability table is switched to another probability table, a probability table to be used for coding the absolute value of the next coefficient value L is determined depending on the table number of the current probability table and the absolute value of the current coefficient value L. The probability tables shall be switched only in one direction, and once the absolute value of a coefficient value L exceeds a predetermined value, the same probability table is used from then on for performing arithmetic coding.

When scanning is applied from the high-frequency domain first and then to the low-frequency domain, it is likely that the absolute value of the coefficient value L becomes larger, since the absolute value of coefficient value L becomes generally larger toward the low-frequency domain. Therefore, once the absolute value of the coefficient value L exceeds a predetermined value, even if the absolute value of another coefficient value L becomes smaller than the predetermined value after that, it is highly possible that only the absolute value of such coefficient value is small. Thus, by performing arithmetic coding with the use of the same probability table, update of a probability table becomes more easily adaptive to the inputs. This consequently makes it possible for the occurrence probability of symbols ("0" or "1" in binary data) in each probability table to be more biased (i.e. the occurrence probability of either "0" or "1" becomes a value closer to 1.0). Arithmetic coding has a characteristic that the more biased probability values in a probability table are, the higher the coding efficiency becomes. Consequently, the coding efficiency can be improved by using the variable length coding method according to the present invention.

The picture coding apparatus according to the present invention has been explained using the present embodiment, but the present invention is not limited to this.

In the present embodiment, for example, an explanation is provided for the case where a picture is coded by means of intra-picture coding, but the same effects can be obtained also for the case where a picture is coded by means of inter-picture coding by performing motion compensation and others on an input moving picture.

Furthermore, in the present embodiment, although an explanation is given for the case where an input picture is divided into pixel blocks, each of which has a size of 4 (horizontal)×4 (vertical) pixels, a different size can be given for the pixel block.

Also, in the present embodiment, although FIG. 15B is used to explain a method of performing scanning within a coefficient block, another scanning order may also be employed as long as scanning is performed from the low-frequency domain toward the high-frequency domain.

Moreover, in the present embodiment, an explanation is given for the case where the RL sequence generation unit 201 converts quantized frequency coefficients into one-dimensionalized coefficients using a predetermined scanning method, and generates a sequence (RL sequence) made up of combinations of R indicating the number of consecutive zero coefficient values and L indicating a non-zero coefficient value subsequent to it, but a sequence of the numbers R and a sequence of the coefficient values L may be generated separately. When a sequence of coefficient values L is generated, for example, the reordering unit 202 may be omitted, if such sequence is generated by performing scanning starting at the high-frequency domain toward the low-frequency domain and by selecting the coefficients whose values indicate other than zero.

Furthermore, an explanation is given in the present embodiment for the case in which probability tables are switched according to the transition table illustrated in FIG. 17, but different values may be given for the number of probability tables and for threshold values for the absolute value of the coefficient value L when probability tables are switched as illustrated in FIG. 17.

Also, FIG. 21 is presented as an example of a binary table, but another table may be employed.

Furthermore, in the present embodiment, an explanation is given for the case where the arithmetic coding unit performs binary arithmetic coding, however, multi-value arithmetic coding may be performed. In such case, it is possible to omit the binarization unit 203.

(Fourth Embodiment)

The following explains a picture decoding apparatus according to the fourth embodiment of the present invention with reference to the diagrams.

Figure 19:
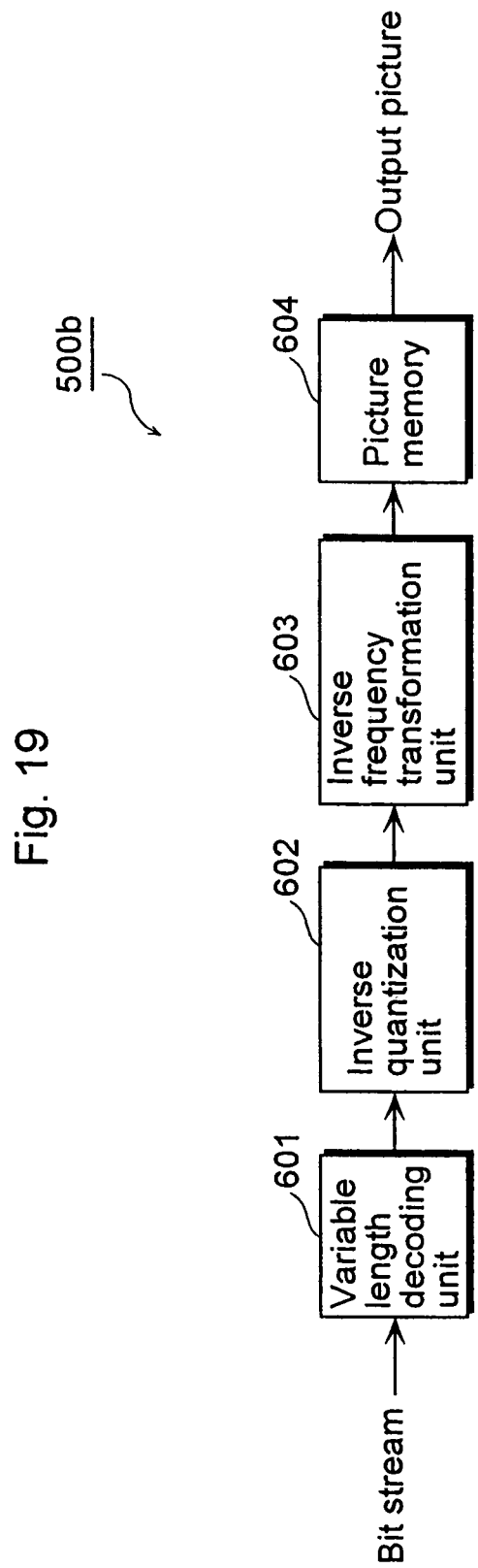
FIG. 19 is a block diagram showing a structure of a picture decoding apparatus according to a fourth embodiment of the present invention.

FIG. 19 is a block diagram showing a structure of a decoding apparatus 500b according to the fourth embodiment of the present invention.

This decoding apparatus 500b performs intra picture decoding on a bit stream resulted from performing intra-picture coding on picture data, and is comprised of a variable length decoding unit 601, an inverse quantization unit 602, an inverse frequency transformation unit 603, and a picture memory 604. The bit stream to be inputted here is generated using the variable length coding method employed by the coding apparatus 100b according to the third embodiment, and is firstly obtained by the variable length decoding unit 601.

On the receipt of the bit stream, the variable length decoding unit 601 generates a coefficient block made up of a plurality of coefficients as shown in FIG. 15A by performing variable length decoding on such bit stream.

The inverse quantization unit 602, receiving the coefficient block from the variable length decoding unit 601, performs inverse quantization on such coefficient block. Inverse quantization here means to integrate a predetermined quantization value to each coefficient in the coefficient block. Generally, a quantization value varies on a coefficient block or a frequency band basis, and is obtained from a bit stream. The inverse quantization unit 602 then outputs the inverse-quantized coefficient block to the inverse frequency transformation unit 603.

The inverse frequency transformation unit 603 performs inverse frequency transformation on the inverse-quantized coefficient block, and converts the coefficient block into a pixel block. Then, the inverse frequency transformation unit 603 outputs the converted pixel block to the picture memory 604.

The picture memory 604 stores the decoded pixel blocks in sequence, and when the pixel blocks equivalent to a picture are stored, it outputs these pixel blocks as an output picture.

Here, a detailed explanation is given for the variable length decoding unit 601 described above.

Figure 20:
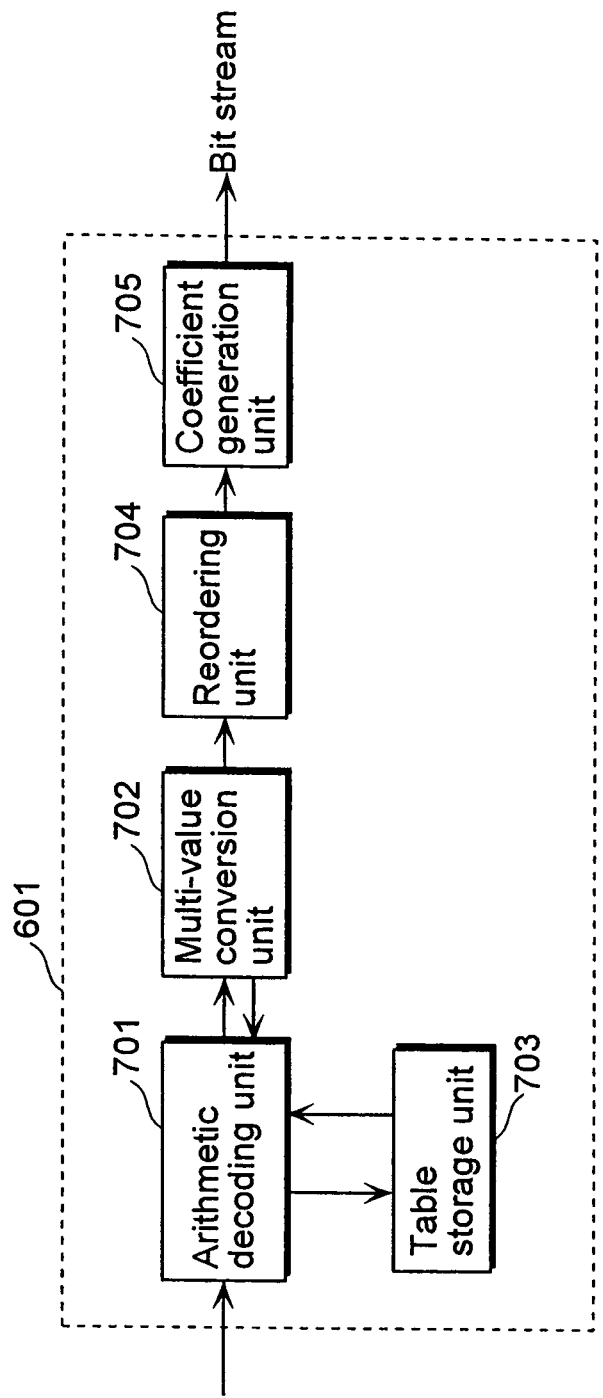
FIG. 20 is a block diagram showing an internal structure of a variable length decoding unit according to the fourth embodiment of the present invention.

FIG. 20 is a block diagram showing an internal structure of the variable length decoding unit 601.

As shown in FIG. 20, the variable length decoding unit 601 is comprised of an arithmetic decoding unit 701, a multi-value conversion unit 702, a table storage unit 703, a reordering unit 704, and a coefficient generation unit 705.

The table storage unit 703 stores, for example, four probability tables 1~4 as shown in FIG. 18.

On the receipt of the bit stream, the arithmetic decoding unit 701 firstly performs arithmetic decoding on the bit stream. Here, an explanation is given for binary arithmetic decoding to be performed on the absolute values (binarized ones) of coded coefficient values L included in the bit stream.

When performing arithmetic decoding on the absolute value of the coded coefficient value L, the arithmetic decoding unit 701 obtains, from the multi-value conversion unit 702, the absolute value of the previous coefficient value L which has already been decoded and converted into a multi-value. Then, the arithmetic decoding unit 701 switches between the probability tables 1~4 stored by the table storage unit 703 in a manner as shown in FIG. 17, depending on the absolute value of such coefficient value L, and performs binary arithmetic decoding on the absolute value of each of the coded coefficient values L so as to output binary data corresponding to each of them.

The multi-value conversion unit 702 converts the binary data outputted by the arithmetic decoding unit 701 into multi-values, using, for example, a binary table as shown in FIG. 21, so as to represent them as the absolute values of the coefficient values L. Then, the multi-value conversion unit 702 outputs the absolute values of such coefficient values L to the arithmetic decoding unit 701 and the reordering unit 704.

An explanation is given for detailed operations of the arithmetic decoding unit 701 and the multi-value conversion unit 702.

First, the arithmetic decoding unit 701 uses the probability table 1 to perform arithmetic decoding on the absolute value of the first coded coefficient value L. The arithmetic decoding unit 701 then outputs, to the multi-value conversion unit 702, the binary data obtained by performing the arithmetic decoding. The multi-value conversion unit 702 uses the binary table so as to convert the binary data into the absolute value of the coefficient value L, and outputs the absolute value to the arithmetic decoding unit 701 and the reordering unit 704.

Then, for the absolute values of the subsequent coded coefficient values L, the arithmetic decoding unit 701 switches the probability table to another one for use, depending on the table number of the probability table used when the absolute value of the previous coded coefficient value L is binary arithmetic decoded as well as on the absolute value of such previous coefficient value L obtained from the multi-value conversion unit 702. As shown in FIG. 17, the probability table 2 is used when one of the followings is satisfied: when the probability table 1 is used to perform arithmetic decoding on the absolute value of the previous coded coefficient value L and the absolute value of the previous coefficient value L obtained form the multi-value conversion unit 702 indicates "1"; and when the probability table 2 is used to perform arithmetic decoding on the absolute value of the previous coded coefficient value L and the absolute value of the previous coefficient value L obtained form the multi-value conversion unit 702 indicates "1". The probability table 3 is used when one of the followings is satisfied: when the probability table 1 is used to perform arithmetic decoding on the absolute value of the previous coded coefficient value L and the absolute value of the previous coefficient value L obtained form the multi-value conversion unit 702 indicates "2"; when the probability table 2 is used to perform arithmetic decoding on the absolute value of the previous coded coefficient value L and the absolute value of the previous coefficient value L obtained form the multi-value conversion unit 702 indicates "2"; and when the probability table 3 is used to perform arithmetic decoding on the absolute value of the previous coded coefficient value L and the absolute value of the previous coefficient value L obtained form the multi-value conversion unit 702 indicates "2 or smaller". And the probability table 4 is used when one of the followings is satisfied: when the absolute value of the previous coefficient value L obtained form the multi-value conversion unit 702 indicates "3 or a larger value"; and when the probability table 4 is used to perform arithmetic decoding on the absolute value of the previous coded coefficient value L. As shown above, the probability tables 1~4 are switched in one direction, that is, from a probability table with a smaller table number to a probability table with a larger table number. Accordingly, even if the absolute value of the previous coefficient value L obtained from the multi-value conversion unit 702 is equal to or smaller than a predetermined threshold value, the probability tables shall not be switched in the opposite direction. This is the point that distinguishes the present invention from the existing technique.

The following explains an example of switching between the probability tables, in a case where decoding is performed on the absolute values of coefficient values L shown in FIG. 16C.

The arithmetic decoding unit 701 uses the probability table 1 to perform arithmetic decoding on the absolute value of the first coded coefficient value L (−2) so as to decode it into binary data "01". Since the arithmetic decoding unit 701 obtains, from the multi-value conversion unit 702, "2" which is a multi-value converted from such binary data "01", it switches from the probability table 1 to the probability table 3 for use. Accordingly, the arithmetic decoding unit 701 uses the probability table 3 to perform arithmetic decoding on the absolute value of the second coded coefficient value L (3) so as to decode it into binary data "001". Here, since the arithmetic decoding unit 701 obtains, from the multi-value conversion unit 702, "3" which is a multi-value converted from such binary data "001", it switches from the probability table 3 to the probability table 4 for use. Accordingly, the arithmetic decoding unit 701 uses the probability table 4 to perform arithmetic decoding on the absolute value of the third coded coefficient value L (6) so as to decode it into binary data "000001". Here, since the probability table to be used is switched to the probability table 4, the arithmetic decoding unit 701 uses the probability table 4 to perform arithmetic decoding on the absolute values of all the subsequent coded coefficient values L. For example, the absolute value of the fifth coded coefficient value L is decoded and converted into a multi-value "2", but unlike the existing technique, the arithmetic decoding unit 701 uses the probability table 4 to perform arithmetic decoding on the absolute value of the sixth coded coefficient value L and thereafter, without switching to another probability table.

Through the above operation, when the absolute values of coefficient values L, the numbers R, and the signs of the coefficient values L equivalent to one coefficient block are generated, they are inputted to the reordering unit 704 as an RL sequence.

The reordering unit 704 sorts such inputted RL sequence in reverse order. However, the number of coefficients shall not be reordered. FIG. 16A illustrates a reordered RL sequence. Subsequently, the reordering unit 704 outputs, to the coefficient generation unit 705, the RL sequence thus reordered.

The coefficient generation unit 705 converts the inputted RL sequence into a coefficient block. In so doing, the coefficient generation unit 705 makes a conversion from the RL sequence into a coefficient block by repeatedly carrying out the following operation: generating zero coefficients for the number indicated by a number R and then generating a coefficient with a value indicated by a coefficient value L. Here, the coefficient generation unit 705 performs zigzag scanning starting at the low-frequency domain toward the high-frequency domain, as shown in FIG. 15B, so as to convert the RL sequence shown in FIG. 16A into the coefficient block shown in FIG. 15A. Then, the coefficient generation unit 705 outputs, to the inverse quantization unit 602, the coefficient block thus generated.

As described above, in the arithmetic decoding method employed by the variable length decoding unit 601 in the decoding apparatus 500b according to the present invention, a plurality of probability tables are switched when arithmetic decoding is performed on the absolute values of coefficient values L included in an input bit stream. When switching to another probability table, the probability table to be used for decoding the absolute value of the next coefficient value L is determined depending on the table number of the current probability table and on the absolute value of a coefficient value L resulted from decoding. The probability tables are switched only in one direction in this case, and when the absolute value of the coefficient value L resulted from decoding exceeds a predetermined value, the same probability table is used to perform arithmetic decoding on all the subsequent absolute values.

As is obvious from the above, the use of the arithmetic decoding method according to the present invention makes it possible to properly decode a bit stream coded with the use of the variable length coding method according to the present invention.

The decoding apparatus according to the present invention has been explained in the above using the present embodiment, but the present invention is not limited to this.

In the present embodiment, for example, an explanation is provided for the case where decoding is performed on a bit stream which has been generated using intra-picture coding, but the same effects can be achieved also for the case where decoding is performed on a bit stream which has been generated using inter-picture coding by performing motion compensation and others on an input moving picture.

Furthermore, in the present embodiment, an explanation is given for the case where a bit stream in which picture data is coded being divided into pixel blocks, each of which has a size of 4 (horizontal)×4 (vertical) pixels, however, a different size may be given for the pixel block.

Moreover, an explanation is given in the present embodiment for the case where four probability tables are used and switched according to the transition table illustrated in FIG. 17, but different values may be employed for the number of probability tables and threshold values for the absolute values of coefficient values L when probability tables are switched as illustrated in FIG. 17.

Also in the present embodiment, although FIG. 15B is used to explain a method of performing scanning within a coefficient block, another scanning order may also be employed providing that it is the same as the scanning method employed at the time of coding.

Furthermore, an example of a binary table is described with reference to FIG. 21, but another table may be employed providing that it is the same as the binary table used at the time of coding.

Moreover, although an explanation is given in the present embodiment for the case where the arithmetic decoding unit 701 performs binary arithmetic decoding, multi-value arithmetic decoding may be performed instead. In such case, it is possible to omit the multi-value conversion unit 702.

Subsequently, other embodiments according to the present invention are further described with reference to the diagrams.

(Fifth Embodiment)

Figure 22:
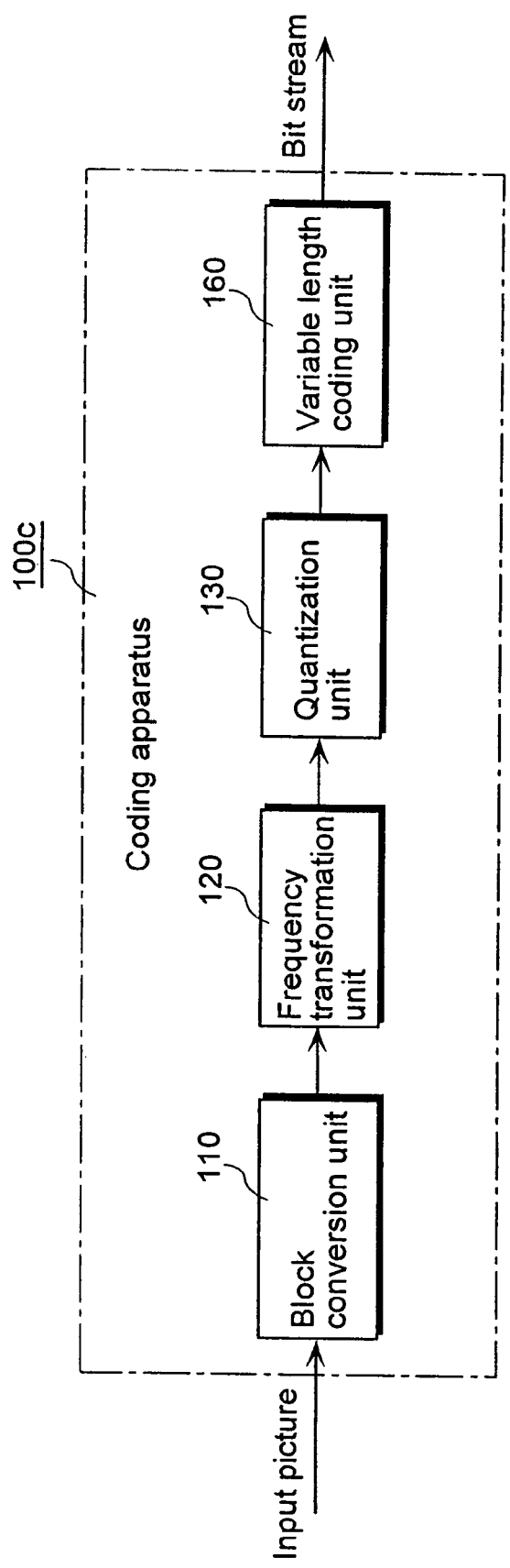
FIG. 22 is a block diagram showing a functional structure of a coding apparatus, to which a variable length coding method and a moving picture coding method according to a fifth embodiment of the present invention, are applied.

FIG. 22 is a block diagram showing a functional structure of a coding apparatus 100c to which the variable length coding method according to the present invention and the moving picture coding method using it are applied. In the fifth embodiment, the functional structure for a case of intra-picture coding an input picture using the moving picture coding method of the present invention is described as illustrated for the coding apparatuses 100a and 100b described in the first and third embodiments. Also, each unit composing such coding apparatus 100c can be realized with a CPU, a ROM for storing in advance a program or data executed by the CPU and a memory for providing a work area in executing the program as well as for storing temporally the input picture, or the like.

As shown in FIG. 22, the coding apparatus 100c according to the fifth embodiment is comprised of the block conversion unit 110, the frequency transformation unit 120, the quantization unit 130 and a variable length coding unit 160.

Here, the coding apparatus 100a according to the first embodiment is structured so that pairs of R and L are coded using a plurality of variable length coding tables (VLC tables) and the coding apparatus 100b according to the third embodiment is structured so that L and R are arithmetic-coded separately using a plurality of probability tables. However, the coding apparatus 100c according to the fifth embodiment is structured so that L and R are coded separately using a plurality of the VLC tables, which distinguishes the coding apparatus 100c from the coding apparatuses 100a and 100b. Therefore, the coding apparatus 100c includes the variable length coding unit 160 instead of the variable length coding units 140 and 150 in the coding apparatuses 100a and 100b. As for other components, the descriptions are abbreviated since they are the same as those described for the coding apparatuses 100a and 100b, and the variable length coding unit 160 is described in detail.

The variable length coding unit 160 generates an L sequence and an R sequence based on the frequency coefficients quantized by the quantization unit 130 and then generates a bit stream of absolute values of coefficients |L|, or the like, using a one-dimensional VLC switching method.

Figure 23:
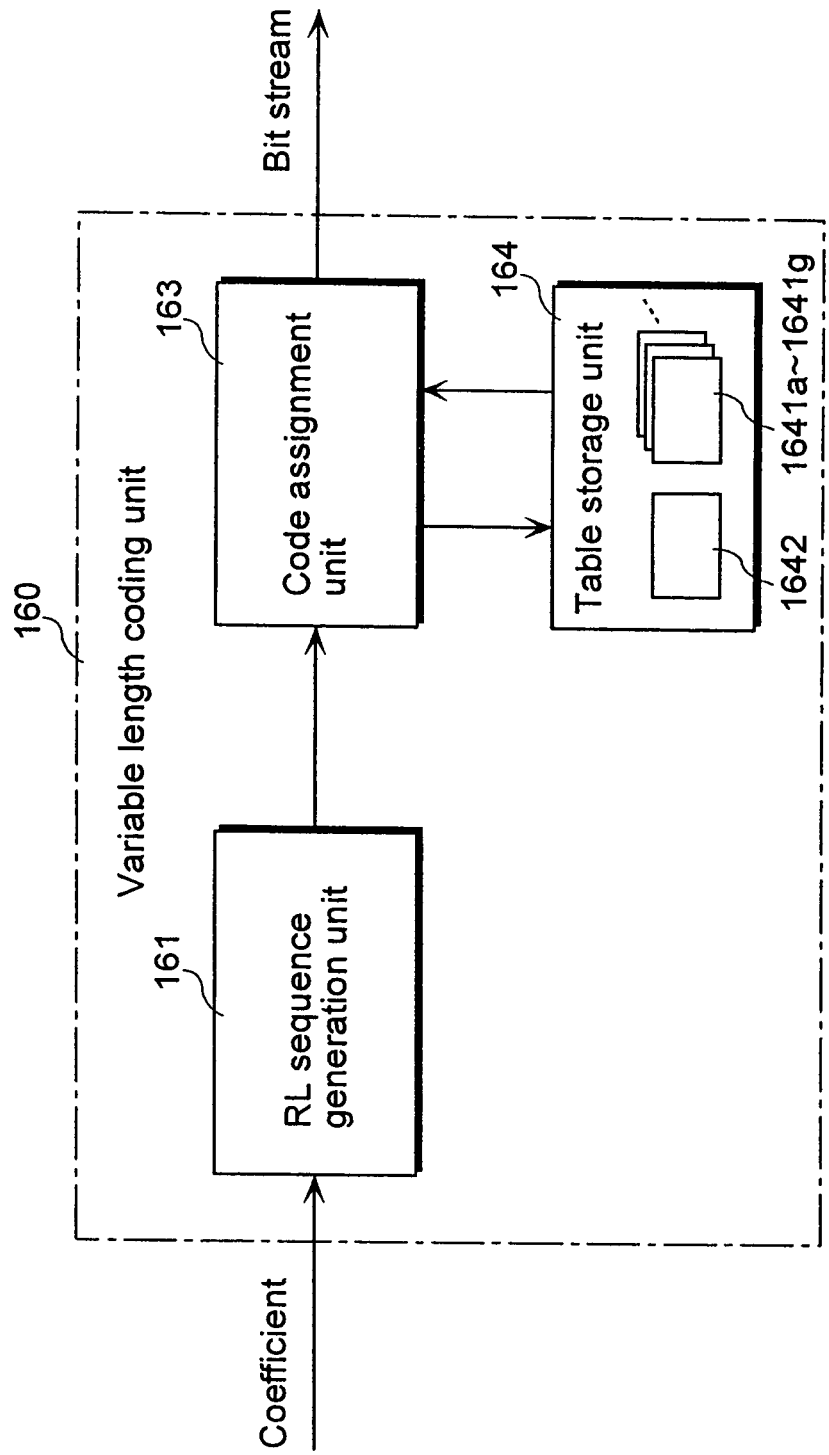
FIG. 23 is a block diagram showing in detail a functional structure of a variable length coding unit shown in FIG. 22.

FIG. 23 is a block diagram showing in detail a functional structure of the variable length coding unit 160.

As shown in FIG. 23, the variable length coding unit 160 is comprised of an RL sequence generation unit 161, a code assignment unit 163 and a table storage unit 164.

The RL sequence generation unit 161 generates the R sequence and the L sequence separately by performing zigzag scanning on the quantized frequency coefficients. (simply to be referred to as "coefficients" hereinafter) starting at the low-frequency domain toward the high-frequency domain.

To be more precise, when the coefficients in the block shown in FIG. 3A are inputted, the RL sequence generation unit 161 performs zigzag scanning as shown in FIG. 3B. The RL sequence generation unit 161 then obtains firstly, for the L sequence, m indicating the number of non-zero coefficient values L, a sequence of absolute values of such coefficients |L| and a sequence of signs for such coefficients, as shown in FIG. 24A. This is because L does not depend on R and can be obtained independently while R depends on L. Subsequently, the RL sequence generation unit 161 generates a sequence of R (R sequence) as shown in FIG. 24B.

The table storage unit 164 stores a plurality of VLC tables (e.g., 8) of 1641a ~1641g for performing variable length coding on each absolute value of the coefficients |L| in the L sequence, a plurality of threshold values for the absolute value of the coefficient |L|, and a threshold value table 1642 for switching adaptively between the VLC tables 1641a ~1641g according to the absolute value of the coefficient |L|.

FIG. 25 is a diagram showing structural examples for the VLC tables 1641a ~1641g. Each of the VLC tables 1641a ~1641g actually correlates absolute values of the coefficients |L| and binary codes, which is shown in a single table in the diagram.

Here, a smaller code number is assigned to the absolute value of the coefficient |L| as an apparition frequency of the absolute value of the coefficient |L| gets higher, and generally, the smaller the absolute value of the coefficient |L| is, the higher the apparition frequency becomes. This is because the largest value of the absolute value of the coefficient |L| disperses, whether in a video or on a screen, so that the apparition frequency of the same value is low whereas the smallest value of the absolute value of the coefficient |L|, namely, a high-frequency component, has a strong tendency to indicate "1" and "2", and thereby the apparition frequency of the same value becomes higher. On the other hand, using only the absolute value of the coefficient |L|, the binary code and the VLC table, which are mutually correlated, makes the code length very long as the absolute value of the coefficient |L| becomes larger. Therefore, the VLC tables 1641a ~1641g to be applied to depending on the absolute value of the coefficient |L| are prepared in advance so that the code length does not become longer even when the absolute value of the coefficient |L| becomes larger.

Each of the VLC tables 1641a ~1641g has a different rate of change in code length for coefficients: a code length for the smallest value of the coefficient gets longer in an ascending order of the number k assigned to each of the tables and a code length for the largest value of the coefficient gets shorter in the ascending order of the number k.

To be more specific, the VLC table 1641a is a table in which a code length is the shortest when the absolute value of the coefficient |L| is small and a code length is the longest when the absolute value of the coefficient |L| is large. Namely, the VLC table 1641a, out of the VLC table 1641a ~1641g, is a table in which the rate of change in code length for absolute values of the coefficients |L| is the largest, and is suitable for the case in which the absolute value of the coefficient |L| is small (e.g., "1"~"3").

The variable length table 1641g is a table in which a code length is the longest when the absolute value of the coefficient |L| is large and a code length is the shortest when the absolute value of the coefficient |L| is large. Namely, the VLC table 1641g, out of the VLC tables 1641a ~1641g, is a table in which the rate of change in code length for absolute values of the coefficients |L| is the smallest, and is suitable for the case in which the absolute value of the coefficient |L| is large (e.g., "193").

The VLC tables 1641b ~1641f are the tables in which the code length gradually gets longer as the absolute value of the coefficient |L| become smaller and gradually gets shorter as the absolute value of the coefficient |L| become larger, in an ascending order from 1641b to 1641f. Namely, the VLC tables 1641b~1641f are the tables in which the rate of change in code length for absolute values of the coefficients |L| gradually gets smaller. The VLC table 1641b is suitable to be used when the absolute value of the coefficient |L| is, for example, between "4" and "6" whereas the VLC table 1641c is suitable to be used when the absolute value of the coefficient |L| is, for example, between "7" and "12".

Thus, it is possible to improve the coding efficiency since the variable length code with the code length based on the coefficient can be adapted to each table. In other words, it is possible to shorten the code length remarkably by switching between the tables depending on the coefficient so that the coefficient may be coded into the variable length code whose code length is shorter at one table than the other table when the coefficient is small and the coefficient may be coded into the variable length code whose code length is shorter at one table than the other when the coefficient is large. Moreover, the improvement of coding efficiency can be realized since a range in which the code length gets shorter can be assigned to each of the tables. The coding does not use arithmetic coding but a VLC method, therefore, complicated processing required of arithmetic coding is unnecessary, and the variable length coding is performed easily by referring to a table once the table is determined for coding.

FIG. 26 is a diagram showing a structural example of the threshold value table 1642.

The threshold value table 1642 is set beforehand according to the characteristics of the VLC tables 1641a ~1641g and keeps a plurality of threshold values to be used for switching between the VLC tables 1641a ~1641f. For example, the threshold values are set respectively as follows: "4" for the switching between the VLC tables 1641a and 1641b, "7" for the switching between the VLC tables 1641b and 1641c, . . . and "193" for the switching between the VLC tables 1641f and 1641g. Thus, the timing for switching between the tables can be predicted easily, therefore, it is possible to switch to the optimal table according to the absolute value of the coefficient |L|.

The code assignment unit 163 performs variable length coding on the absolute values of the coefficients |L| outputted from the RL sequence generation unit 161, separately from the R sequence, using the VLC tables 1641a ~1641g as well as the threshold value table 1642 stored in the table storage unit 164 and then assigns binary codes to them. To put it shortly, the code assignment unit 163 one-dimentionalizes the absolute values of the coefficients |L|.

The following describes a coding operation performed by the coding apparatus 100c. The operations performed by the block conversion unit 110 the quantization unit 130 are abbreviated as they are the same as those described for the coding apparatuses 100a and 100b, and the variable length coding operated by the variable length coding unit 160 is explained in detail.

The frequency coefficients quantized by the quantization unit 130 are inputted to the RL sequence generation unit 161 in the variable length coding apparatus 160.

The RL sequence generation unit 161, as in FIG. 3B, firstly one-dimensionalizes the quantized frequency coefficients in the block by performing zigzag scanning on them starting at the domain of direct current components toward that of high-frequency components. The RL sequence generation unit 161 then generates separately a sequence of "L"s, each of which indicates a non-zero coefficient (to be referred to as "L sequence" hereinafter) and a sequence of "R"s, each of which indicates the number of consecutive zero coefficients (to be referred to as "R sequence" hereinafter). FIGS. 24A and 24B show examples of the generated L sequence and R sequence. As for the L sequence, it can be divided into the number of coefficients m, absolute values of the coefficients |L| and signs of the coefficients. Regarding the signs of the coefficients, "0" indicates that the coefficient is positive whereas "1" indicates that the coefficient is negative.

Here, the coefficient of the L sequence nears to "1" by scanning from the low-frequency domain toward the high-frequency domain since the coefficient of the high frequency component generally tends to become "0".

The code assignment unit 163 codes each L value in the L sequence generated by the RL sequence generation unit 161 in an order opposite to the order used for zigzag scanning, that is, starting from the high frequency coefficients. Namely, the code assignment unit 163 obtains in sequence Huffman codes (variable length codes) corresponding to the absolute values of the coefficients |L| starting from the end of the L sequence, using the VLC tables 1641a ~1641g.

The reason for coding the L value in an order reverse to the order used for zigzag scanning is that non-zero coefficients in the high-frequency domain converge on a periphery of the coefficient "1", and it is easy to determine the first table for coding, to generate the VLC tables 1641a ~1641g and to determine the threshold values.

The code assignment unit 163 assigns the variable length codes to "L"s in the L sequence and "R"s in the R sequence using various tables stored in the table storage unit 164. The code assignment unit 163 also assigns a variable length code to the number of coefficients m, but processing of assigning the variable length codes to the absolute values of the coefficients |L| is described here.

Figure 27:
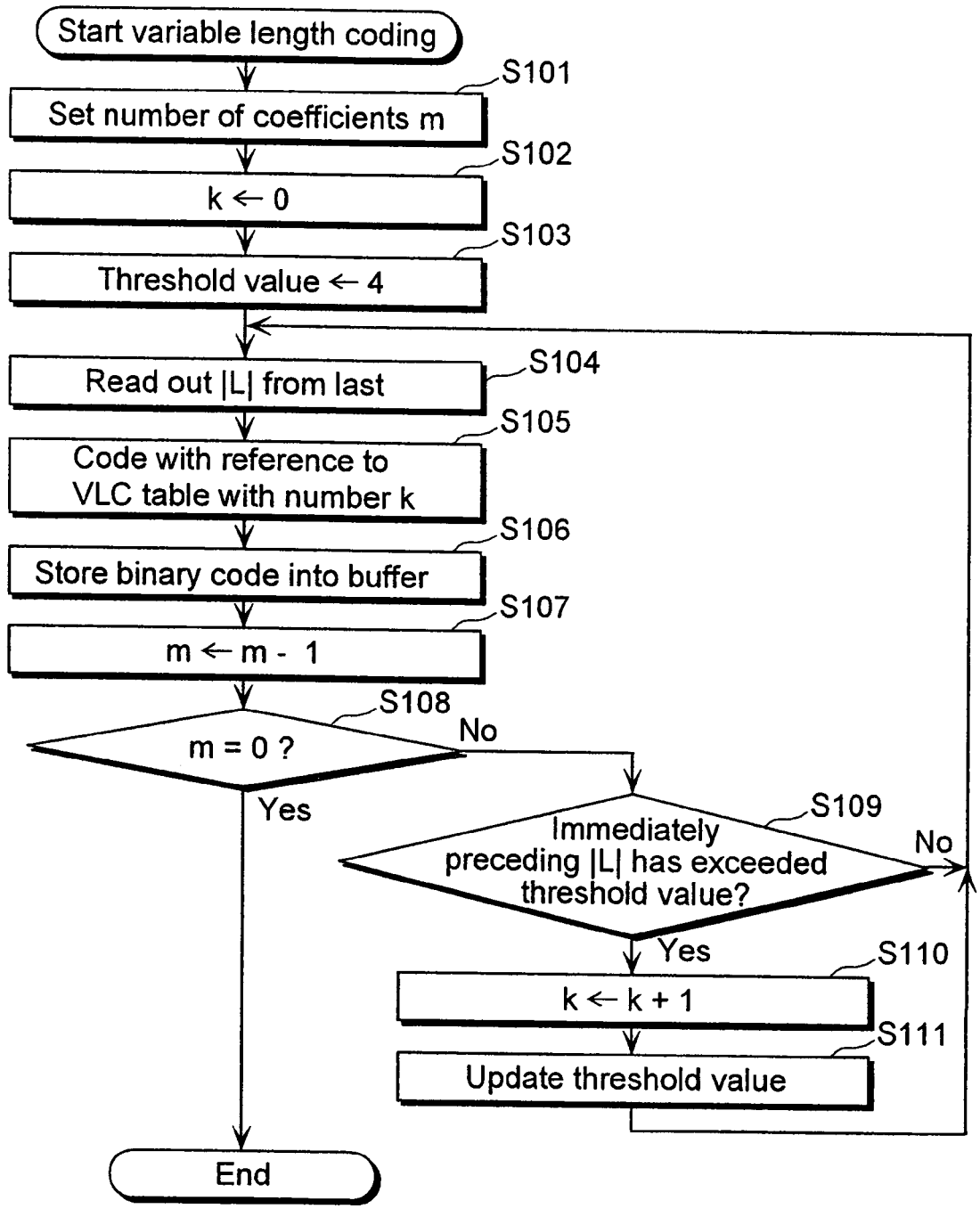
FIG. 27 is a flowchart showing processing of assigning variable length codes, executed by a code assignment unit shown in FIG. 23.

FIG. 27 is a flowchart showing processing of assigning the variable length codes operated by the code assignment unit 163.

The code assignment unit 163 sets the number of coefficients m outputted from the RL sequence generation unit 161 as a start for coding of the coefficients (absolute values of the coefficients |L|) in the block (S101). Then, the code assignment unit 163 sets "0" for the table number k as an initial value of the VLC table to be used for reference (S102), refers to the threshold value table 1642 and sets a threshold value to "4" (S103).

When the settings of the number of coefficients m, the referential VLC table (VLC table 1641a in this case) and the threshold value are terminated, the code assignment unit 163 reads out the absolute value of the coefficient |L|, which is outputted by the RL sequence generation unit 161, starting from the last (S104) and codes the read-out absolute value of the coefficient |L| into a variable length code using the VLC table with the number set beforehand (S105). Then, when the coding is over, the code assignment unit 163 stores the binary code obtained by the coding in a buffer (e.g., FILO buffer) that is not shown in the diagram (S106), decrements the number of coefficients m by "1" (S107) and judges whether the decremented number m indicates "0" or not, namely, whether all the coefficients included in the L sequence are coded or not (S108).

When the number of coefficients m does not indicate "0" (No in S108), it is judged whether or not the absolute value of the immediately preceding coefficient has exceeded the threshold value (S109). When it does not exceed the threshold value (No in S109), the code assignment unit 163 reads out the absolute value of the next coefficient |L|, starting from the last (S104), and executes Steps S105~S108, or the like. Namely, the code assignment unit 163 codes the absolute value of the next coefficient using the same VLC table as used for the previous coefficient.

When the absolute value of the immediately preceding coefficient |L| has exceeded the threshold value (No in S109), the code assignment unit 163 increments the table number k by "1" (S110). Thus, in coding the absolute value of the next coefficient |L|, the VLC table with low rate of change in code length, which is applicable to the coding of the absolute value of the coefficient |L| whose code length is long, is referred to (for instance, the VLC table 1641b with k=1 is referred to when the previous VLC table is 1641a with k=0).

When the increment for the table number k is terminated, the code assignment unit 163 refers to the threshold value table 1642 and updates it to the next threshold value (e.g. "7"

when the previous threshold value is "4") (S111). Thus, the table can be switched to the next VLC table with a low rate of change in code length, which is applicable to the coding of the absolute value of the coefficient |L| whose code length is long, only when the absolute value of the coefficient |L| has exceeded the new threshold value.

Figure 28:
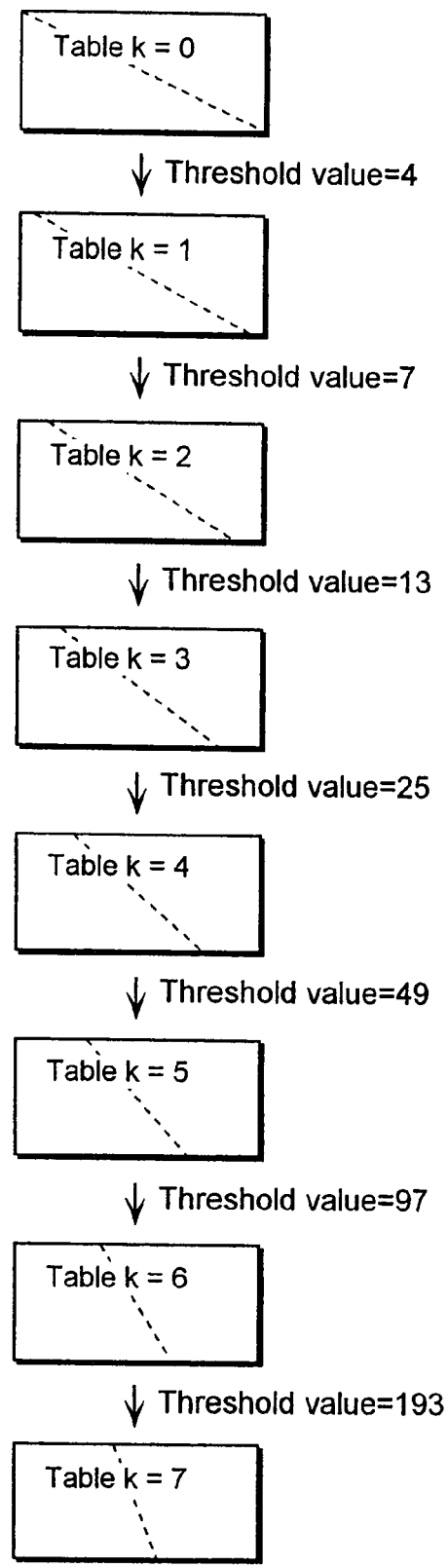
FIG. 28 is a diagram showing a relationship between the VLC table used for coding and a threshold value.

More precisely, when the absolute value of the previous coefficient |L| has exceeded the threshold value "4" assigned to the switching between the VLC tables 1641a with the table number "0" and 1641b with the table number "1", the reference is switched from the VLC table 1641a to the VLC table 1641b for coding the absolute value of the next coefficient, and the threshold value is set to "7", as shown in FIG. 28.

Similarly, when the absolute value of the previous coefficient |L| has exceeded the threshold value "7"~"193" between the VLC table 1641b with the table number "1" and the VLC table 1641g with the table number "6", the reference for coding the absolute value of the next coefficient |L| is switched sequentially from the VLC table 1641b with the table number "1" to the VLC table 1641c with the table number "2", . . . and to the VLC table 1641g. This is shown in FIG. 28.

Here, a direction of switching between the tables is one-directional and does not go back. Thus, the frequent switching of the tables depending on the coefficient can be prevented and thereby the number of times switching between the tables can be reduced. For example, since the work area in the memory is limited in space, only the table to be used is stored. In this case, it takes time to start coding the next coefficient since it takes time to read out the next table from the ROM and expand it in the work area each time the table is switched. Switching one-directionally in this way between the tables is effective in limiting the number of times switching between the tables and in abbreviating the total time necessary for coding the next coefficient.

When the increment of the table number and the update of the threshold value as such are terminated, the code assignment unit 163 reads out the absolute value of the next coefficient |L|, starting from the last (S104) and executes Steps S105~S108, or the like. Namely, the coding is performed using the VLC table suitable for the case where the absolute value of the coefficient |L| is larger than the one before.

Such processing is executed repeatedly until the number of coefficients m indicate "0", which is the time when the coding of the absolute values of the coefficients |L| in the current block ends.

To be more concrete, when the sequence of the absolute values of the coefficients |L| in the block are "1", "1", "2", "3", "4", "12", "2", "3", "31", "22", "5", "9" and "38", starting from the end of the sequence, the code assignment unit 163 codes them Respectively into binary codes "1", "1", "010", "011", "00100" and "0001100" in this order using firstly the VLC table 1641a. The code assignment unit 163 then switches the table for coding to the VLC table 1641b with the table number k=1 since the threshold value "4" is exceeded when the absolute value of the coefficient |L| indicating "12" is coded.

The code assignment unit 163 then codes respectively the absolute value of the next coefficient |L| indicating "2", "3" and "31" into binary codes "11", "0100" and "0000100000" with the use of the VLC table 1641b to which the table is switched. The code assignment unit 163 then switches the table for coding to the VLC table 1641c with the table number k=2 since the threshold value "7" is exceeded in coding the absolute value of the coefficient |L| indicating "31".

Furthermore, the code assignment unit 163 codes the absolute value of the next coefficient into a binary code "0011001" using the VLC table 1641c to which the table is switched. The code assignment unit 163 then switches the table for coding to the VLC table 1641d with the table number k=3 since the threshold value "13" is exceeded in coding the absolute value of the coefficient |L| indicating "22".

The code assignment unit 163 then codes respectively the absolute values of the following coefficients |L| indicating "5", "9" and "38" into binary codes "1100", "010000" and "00101101" using the VLC table 1641d to which the table is switched.

Consequently, the binary code "1101001100100000110011010000001000000011001110 001000000101101" is stored in the buffer.

The number of coefficients in the L sequence, m, the binary codes of the absolute values of the coefficients |L|, the signs of the coefficients and the binary codes of the R values in the R sequence, which are coded, are also stored in the buffer and transmitted to the decoding apparatus via a recording medium like a CD, and a transmission medium such as an Internet, a satellite broadcasting, or the like.

Here, when it is assumed that the absolute values of the coefficients in the L sequence, "1", "1", "2", "3", "4", "12", "2", "3", "31", "22", "5", "9" and "38" are coded using only the VLC table 1641a, the binary codes are "1", "1", "010", "011", "00100", "0001100", "010", "011", "010", "011", "000011111", "0000010110", "00101", "001001" and "00000100110", of which the code length amounts to 64 bits.

In contrast, by using the coding method according to the fifth embodiment, it is possible to improve coding efficiency even when the largest value of the absolute value of the coefficient |L| in the block is relatively small and the absolute value of the coefficient |L| does not increase gradually since the code length amounts to 61 bits. This ascribes greatly to the fact that when the absolute value of the coefficient |L| indicates, for instance, "22" and "38", it requires 9 bits of "000010110" and 11 bits of "00000100110" using only the VLC table 1641a for the coding whereas it only requires 7 bits of "0011001" and 8 bits of "00101101" using the present method. Therefore, it is possible to improve the coding efficiency remarkably when the largest value of the coefficient |L| in the normal block is relatively high and the absolute value of the coefficient |L| increases gradually.

In the fifth embodiment, when the absolute value of the immediately preceding coefficient |L| has exceeded the threshold value (Yes in S109), the table number k is incremented by "1" (S110) and the coding is performed using the VLC table with the next number (see reference to FIG. 28). However, the table may be skipped to the VLC table adapted to the absolute value of the coefficient |L| depending on the absolute value of the immediately preceding coefficient |L| which has exceeded the threshold value. Namely, when the absolute value of the immediately preceding coefficient |L| to be coded with reference to the table with the number k=1 is "20", for instance, there is a high possibility that the absolute value of the next coefficient |L| is greater than "20", therefore, the table with the number k=3 can be used as reference for coding the absolute value of the next coefficient |L|. In this case, the threshold value may be set to the one corresponding to the VLC table (e.g., 25).

It is explained that eight VLC tables are used, but the number of VLC tables can be either between 2~7 or greater than eight, using a plurality of threshold values, and the VLC table may be switched each time each threshold value is exceeded.

Also, in the fifth embodiment, the absolute value and the sign of the coefficient are coded separately and each VLC table for absolute values of coefficients contains no signs (absolute values), however, the coefficients with the signs may be coded. In this case, the binary codes may include the signs. For instance, 1 bit for the sign may be added to an LSB bit for the variable length code.

In the fifth embodiment, the case in which a picture is coded by means of intra-picture coding is described, however, the same effects can be obtained for the case in which a picture is coded by means of inter-picture coding by performing motion compensation and others on an input moving picture, using the method according to the present embodiment.

Also, the fifth embodiment describes the case of dividing the input picture into blocks, each of which is sized 4 (horizontal)×4 (vertical) pixels, however, a different size can be given for the size of the block.

The fifth embodiment describes a method of scanning a block with reference to FIG. 3B, however, different scanning method can be employed providing that the scanning is performed from the low-frequency domain toward the high-frequency domain.

Also, an example of the VLC table is described with reference to FIG. 25, however, it may be a different table.

The fifth embodiment describes the case of adding the number of L values to the beginning of the L sequence, however, the EOB may be attached to the end of the L sequence.

(Sixth Embodiment)

Figure 30:
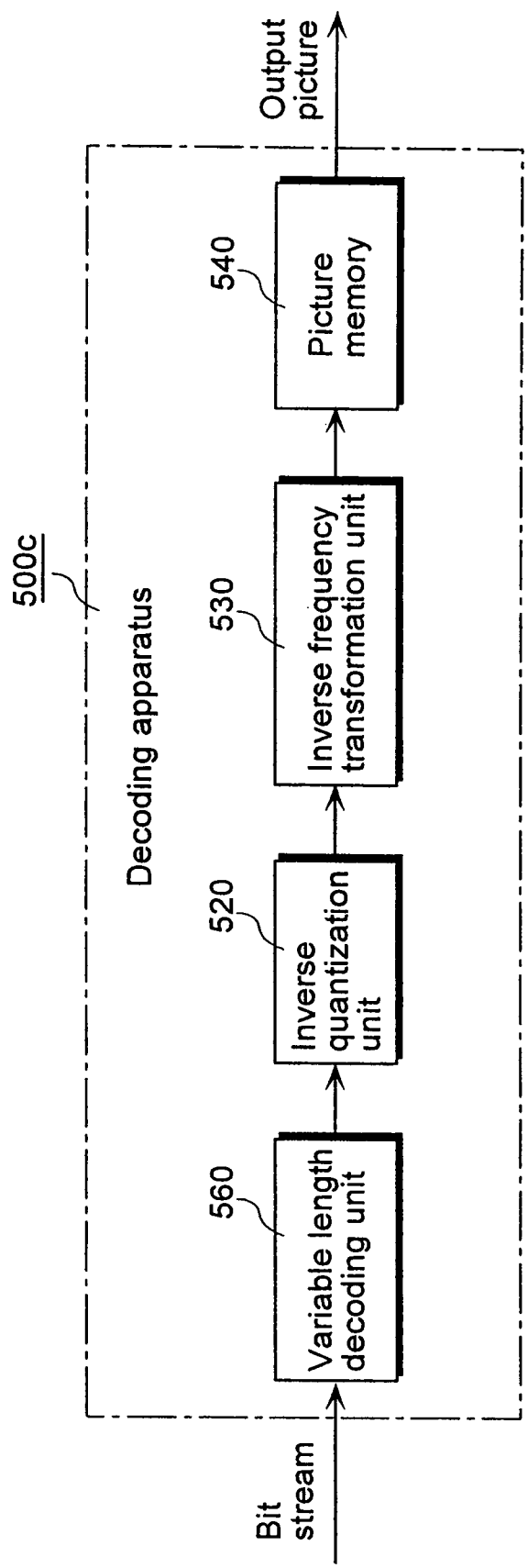
FIG. 30 is a block diagram showing a functional structure of a decoding apparatus using a variable length decoding method and a moving picture decoding method according to a sixth embodiment of the present invention.
Figure 31:
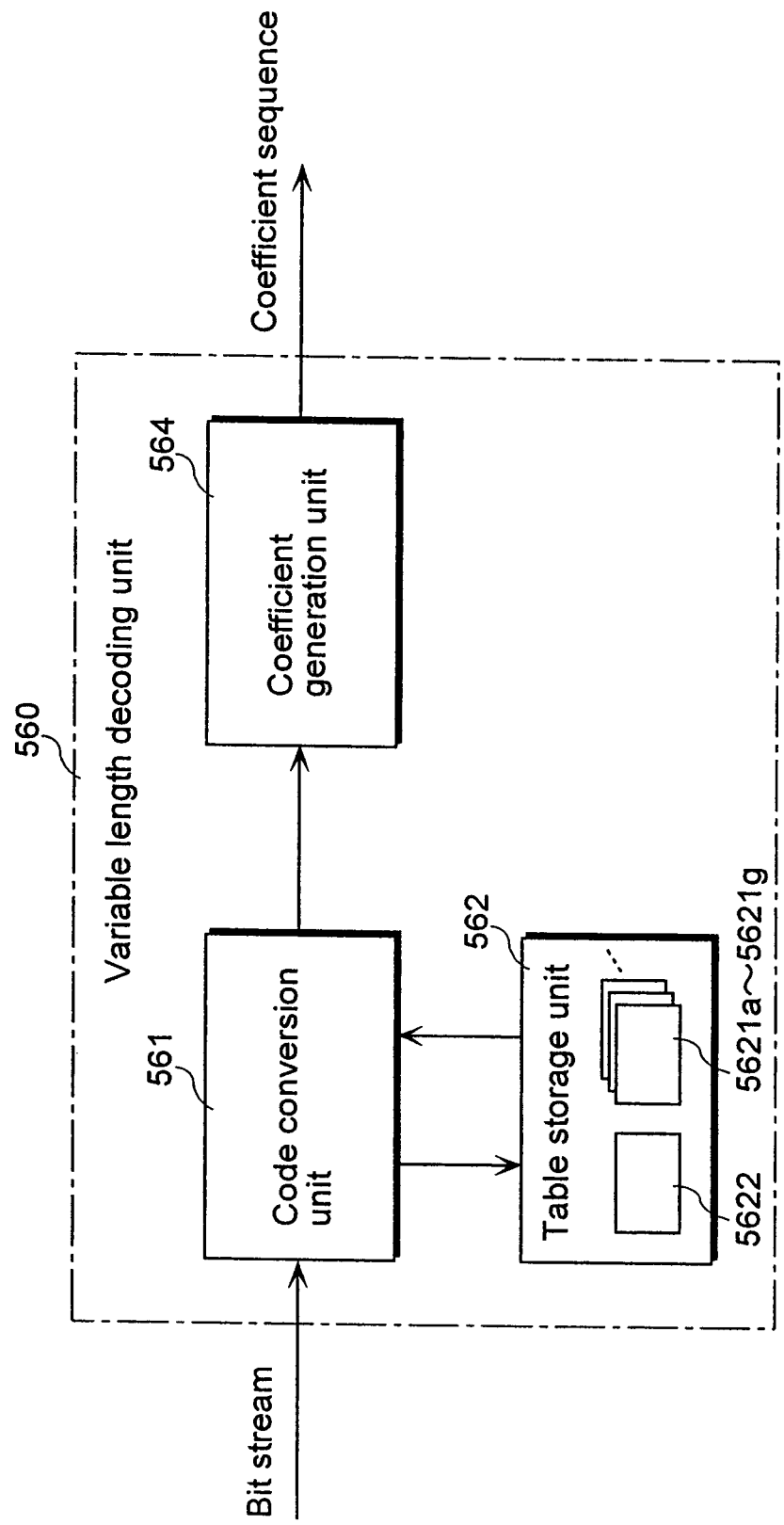
FIG. 31 is a block diagram showing in detail a functional structure of a variable length decoding unit shown in FIG. 30.

FIG. 30 is a block diagram showing a functional structure of a decoding apparatus to which the variable length decoding method and the moving picture decoding method using it according to the embodiment of the present invention are applied. Here, the bit stream generated using the variable length coding method of the present invention described in the fifth embodiment shall be used.

As shown in FIG. 30, the decoding apparatus 500c is comprised of a variable length decoding unit 560, an inverse quantization unit 520, an inverse frequency transformation unit 530 and a picture memory 540. Each unit composing such decoding apparatus 500c can be realized with a CPU, a ROM for storing in advance a program or data executed by the CPU and a memory for providing a work area when the program is executed as well as for storing temporarily an input bit stream, or the like. As for the inverse quantization unit 520, the inverse frequency transformation unit 530 and the picture memory 540, the structures are the same as those described for the decoding apparatuses 500a and 500b, therefore the descriptions are abbreviated, and the structure of the variable length decoding unit 560 is explained in detail.

The variable length decoding unit 560 is comprised of a code conversion unit 561, a table storage unit 562 and a coefficient generation unit 564.

The table storage unit 562 stores in advance a plurality of VLC tables 5621a ~5621g correlating variable length codes with absolute values of a coefficients |L| as well as a threshold value table 5622, or the like. The VLC tables 5621a ~5621g are constructed in the same manner as the VLC tables 1641a ~1641g shown in FIG. 25 and the threshold value table 5622 is constructed in the same manner as the threshold value table 1642 shown in FIG. 26.

The code conversion unit 561 performs conversion on an inputted bit stream so that the variable length codes are converted into the number of coefficients in L sequence m, the absolute values of the coefficients |L| and the R values in the R sequence, using the tables stored in the table storage unit 562 (the VLC tables 5621a~5621g and the threshold value table 5622, and the like). The VLC tables 5621a ~5621g are used for the conversion of the absolute values of the coefficients |L|.

The coefficient generation unit 564 converts the RL values into coefficients based on the inputted L sequence and R sequence and two-dimensionalizes them using a predetermined scanning method. When converting the RL sequence into coefficients, a coefficient "0" is generated for the number indicated by R based on a predetermined scanning order, then, the coefficient indicated by L is generated. Here, assuming that the coefficients are scanned in zigzags starting at the low-frequency domain toward the high-frequency domain, the RL sequence is converted into a coefficient block shown in FIG. 11. The generated coefficient block is inputted to the inverse quantization unit 520.

The following describes decoding operations at each unit in the variable length decoding unit 560.

Here, it is described with an assumption that the codes of the binary code input bit stream inputted by the code conversion unit 561 are "1", "1", "101", "011", "00100", "0001100", "11", "0100", "0000100000", "0011001", "1100", "010000", and "00101101" in sequence starting from the head.

The code conversion unit 561, as a start for decoding the variable length codes, decodes the number of coefficients m outputted from the coding apparatus 100c and sets the decoded number of coefficient m. The code conversion unit 561 then sets a table number k to "0" as an initial value of a reference VLC table. Then, the code assignment unit 163 refers to the threshold value table 5622 and sets a threshold value to "4" (S103). After the number of coefficients m, the reference VLC table (VLC table 5621a in this case) and the threshold value are set, the code conversion unit 561 reads out sequentially the absolute values of the coefficients |L| from the head (namely, from those in the high-frequency domain) in an order in which they are outputted from the coding apparatus 100c and performs variable length decoding on the read-out variable length codes into the absolute values of the coefficients |L| using the VLC table with the set number. After the decoding of each variable length code, the code conversion unit 561 stores the absolute value of the coefficient |L| obtained in the decoding into a buffer that is not shown in the diagram (e.g. FILO buffer), decrements the number of coefficients m by "1" and judges whether or not the number m indicates "0" after the decrement, that is, whether or not all the coefficients included in the L sequence are decoded.

When the number of coefficients m does not indicate "0", it is judged whether or not the absolute value of the immediately preceding coefficient |L| that is variable length decoded has exceeded the threshold value. When it has not exceeded the threshold value, the code conversion unit 561 reads out the next variable length code from the end and decodes it as an absolute value of the coefficient |L| using the same table used for the one before.

When the absolute value of the immediately preceding coefficient |L| that is variable length decoded has exceeded the threshold value, the code conversion unit 561 increments the table number k by "1". Thus, in coding the absolute value of the next coefficient |L|, the VLC table with low rate of change in code length, which is applicable to the coding of the absolute value of the coefficient |L| whose code length is long (for instance, the VLC table 5621b is referred to when the previous VLC table is 5621a), is referred to. When the increment for the table number k is terminated, the code conversion unit 561 refers to the threshold value table 5622 and updates it to the next threshold value (e.g. "7" when the previous threshold value is "4"). Thus, the table can be switched to the next VLC table with low rate of change in code length, which is applicable to the coding of the absolute value of the coefficient |L| whose code length is long, only when the absolute value of the coefficient |L| has exceeded the new threshold value.

To be more concrete, the VLC table 5621a with the table number k=0 is referred to for the first variable length code. Now, assume that the VLC table 5621a is referred to, the variable length code that corresponds to the input bit stream is "1" and the absolute value of the coefficient |L| in this case is "1". Similarly, in proceeding sequentially the conversion of variable length codes into absolute values of the coefficients |L| using the VLC table 5621a, the variable length codes are converted into the absolute values of the coefficients |L| as follows: the variable length code "1" into the absolute value of the coefficient |L| "1"; the variable length code "010" into the absolute value of the coefficient |L| "3"; the variable length code "00100" into the absolute value of the coefficient "4"; and the variable length code "0001100" into the absolute value of the coefficient |L| "12".

Here, assuming that the threshold value for the absolute value of the coefficient |L| is "4", the absolute value of the coefficient |L| exceeds the threshold value when the sixth variable length code is converted. Therefore, the code conversion unit 561 uses the next VLC table 5621b with the number k=1 for the conversion of the subsequent absolute values of the coefficients |L|, sets the threshold value to "7" and converts them into the absolute values of the coefficients |L|. Consequently, the seventh variable length code "11" is converted into the absolute value of the coefficient |L| "2".

The eighth variable length code "0100" is converted into the absolute value of the coefficient |L| "3" whereas the ninth variable length code "000010000" is converted into the absolute value of the coefficient |L| "31". Assuming here that the threshold value for the absolute value of the coefficient |L| is "7", the absolute value of the coefficient |L| exceeds the threshold value at the ninth absolute value of the coefficient |L| "31". Therefore, the code conversion unit 561 uses the VLC table 5621b with the table number k=2 for the conversion of the subsequent absolute values of the coefficients |L|, sets the threshold value to "13" and converts them into the absolute values of the coefficients |L|. Meanwhile, even when the absolute value of the coefficient |L| obtained in the decoding into the seventh absolute value of the coefficient |L| goes below the threshold value "7", the table is not switched back to the VLC table 5621a and performs the conversion using the VLC table 5621b.

With the repetition of the above processing, the absolute values of the coefficients |L| equivalent to a single block ("m" coefficients) are generated and they are reordered reversely using first-in later-out operated by the FILO buffer. The signs are also reordered reversely using first-in later-out operated by the FILO buffer. However, the number shall not be reordered. It is assumed here that the sequence is generated in the same order as used for the L sequence shown in FIG. 24A (namely, an order starting at the low frequency domain toward the high frequency domain).

Each of the absolute values of the coefficients |L| in the L sequence thus reordered is inputted to the coefficient generation unit 564. The code conversion unit 561 decodes each R value in the R sequence using the same processing as used for the absolute values of the coefficients |L| and outputs the R sequence shown in FIG. 24A to the coefficient generation unit 564.

The coefficient generation unit 564 converts the RL sequence into coefficients based on the inputted L sequence and R sequence. In so doing, the coefficient generation unit 564 performs the conversion of the RL sequence into coefficients by repeatedly carrying out the following operation: generating a coefficient "0" for the number indicated by R and then generating the coefficient for the value indicated by L by adding the signs. Here, assume that the scanning is performed in zigzags starting at the low-frequency domain toward the high-frequency domain, the R sequence shown in FIG. 24A and the L sequence shown in FIG. 24B are converted into a coefficient block. The generated coefficient block is inputted to the inverse quantization unit 520.

As described above, in the variable length decoding method according to the sixth embodiment, firstly in the decoding step, a plurality of variable length coding (decoding) tables to be used for decoding are switched in one direction, the variable length codes in the bit stream are decoded into non-zero coefficients according to a frequency domain in a predetermined order, using the VLC table to which the table is switched. Subsequently, in the coefficient conversion step, the non-zero coefficients are converted into coefficients in a block based on the generated coefficients. Here, each of the tables has a different rate of change in code length for coefficients so that a code length of the smallest coefficient gets longer as the number assigned to the table becomes larger and a code length of the largest coefficient gets shorter as the table number becomes larger. The threshold value is set based on the adaptability of each table in which a code length corresponding to a coefficient is shorter than the other table. The variable length codes in the bit stream are ranged in an order starting from the high-frequency components toward the low-frequency components. In the decoding step, the variable length codes are decoded into coefficients according to the order in which the bit stream is composed of, a sequence of coefficients is generated by outputting the decoded coefficients in an order starting from the end of the bit stream. In the coefficient generation step, the coefficients are scanned according to the order in which the sequence of coefficients is composed of.

In the coding step, when the absolute value of the decoded coefficient exceeds the threshold value, the next variable length code is decoded into a coefficient by switching the table used for decoding current variable length code to be decoded to a table whose number is larger than the one assigned to the present table.

With the above processing, the bit stream that is coded using the variable length coding method according to the present invention can be properly decoded by using the variable length decoding method according to the present invention.

In the sixth embodiment, it is assumed that when the absolute value of the immediately preceding decoded coefficient |L| exceeds the threshold value, the table number k is incremented by "1" and the decoding is performed using the VLC table with the next number, as in the fifth embodiment. However, the table may be skipped to the one adapted to the absolute value of the coefficient |L| according to the absolute value of the immediately preceding coefficient which has exceeded the threshold value, under the condition that the method of switching between the tables is the same as the one used for coding. In this case, the threshold value can be set to the one corresponding to the VLC table.

In the sixth embodiment, an example of the VLC table is described with reference to FIG. 25, but a different table may be used providing that it is the one used for coding. Also, the case of using eight VLC tables is described, but the number of the tables can be between two and six or more than eight, using a plurality of threshold values, and the VLC tables can be switched each time each of the threshold values is exceeded. However, the structure of the VLC table and the threshold value here shall be the same as those used for coding.

Also, in the sixth embodiment, the absolute value and the sign of the coefficient are coded separately and each VLC table for absolute values of coefficients contains no signs (absolute values), however, the coefficients with the signs may be coded. In this case, the binary codes may include the signs. For instance, 1 bit may be added for the sign to an LSB bit for the variable length code.

Also, in the sixth embodiment, the VLC table is switched when the value L has exceeded the threshold value. A VLC table with a large number may be used for decoding the absolute values of the coefficients |L| in a descending order (namely, starting from those in the high frequency domain) and may be switched to a VLC table with a small number when the absolute value of the decoded coefficient |L| goes below the threshold value In the sixth embodiment, the case in which a picture is coded by means of intra-picture coding is described, however, the same effects can be obtained for the case in which a picture is coded by means of inter-picture coding by performing motion compensation and others on an input moving picture, using the method according to the present embodiment.

Also, the sixth embodiment describes the case of dividing the input picture into blocks, each of which is sized 4 (horizontal)×4 (vertical) pixels, however, a different size may be given for the size of the block.

The sixth embodiment describes a method of scanning a block with reference to FIG. 11, however, a different scanning order can be used providing that it is the same as the one used for coding.

(Seventh Embodiment)

The following describes an example of realizing the variable length coding method, variable length decoding method, a variable length coding apparatus, the variable length decoding apparatus, the moving picture coding method, the moving picture decoding method, the moving picture coding apparatus and the moving picture decoding apparatus according to the present invention in another embodiment.

It is possible to perform the processing described in each of the above embodiments in an independent compute system by recording a program for realizing the structures of the coding apparatus or the decoding apparatus shown in each of the above embodiments in a recording medium such as a flexible disk or the like.

FIG. 32 is an illustration for carrying out the moving picture coding method described in the first, third and fifth embodiments or the moving picture decoding method described in the second, fourth and sixth embodiments in the computer system using the program recorded onto the flexible disk on which the program is recorded.

Figure 32A:
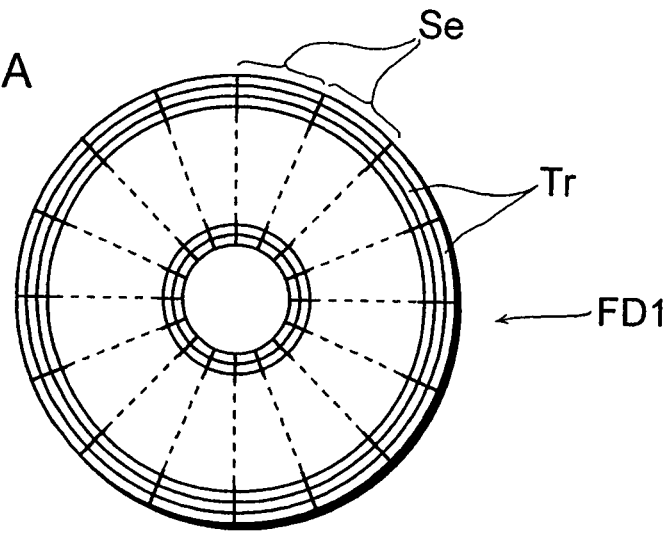
FIGS. 32A, 32B and 32C are illustrations for a case of performing the moving picture coding method according to the first, third and fifth embodiments or the moving picture decoding method according to the second, fourth and sixth embodiments in a computer system using a flexible disk on which a program for executing these methods is recorded.
Figure 32B:
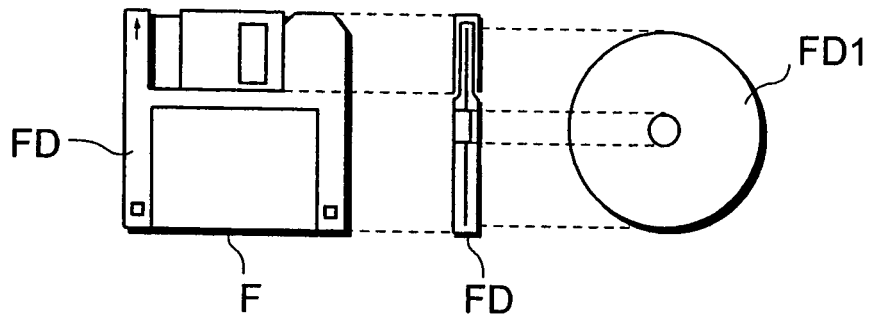

FIG. 32B shows a full appearance of a flexible disk, its structure at cross section and the flexible disk itself whereas FIG. 32A shows an example of a physical format of the flexible disk as a main body of a storage medium. A flexible disk FD is contained in a case F with a plurality of tracks Tr formed concentrically from the periphery to the inside on the surface of the disk, and each track is divided into 16 sectors Se in the angular direction. Thus, the program is stored in an area assigned for it on the flexible disk FD.

Figure 32C:
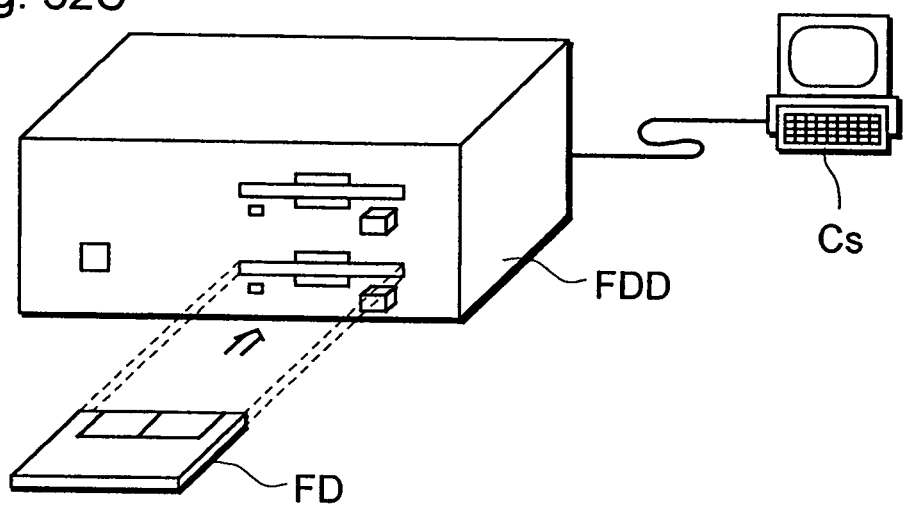

FIG. 32C shows a structure for recording and reading the program on the flexible disk FD. When the program is recorded on the flexible disk FD, the computer system Cs writes in the program via a flexible disk drive. When the coding apparatus and the decoding apparatus are constructed in the computer system using the program on the flexible disk, the program is read out from the flexible disk and then transferred to the computer system by the flexible disk drive.

The above explanation is made on an assumption that a storage medium is a flexible disk, but the same processing can also be performed using an optical disk. In addition, the storage medium is not limited to a flexible disk and an optical disk, but any other medium such as an IC card and a ROM cassette capable of recording a program can be used.

The following is a description for the applications of the picture coding/decoding method illustrated in the above-mentioned embodiment and a system using them.

Figure 33:
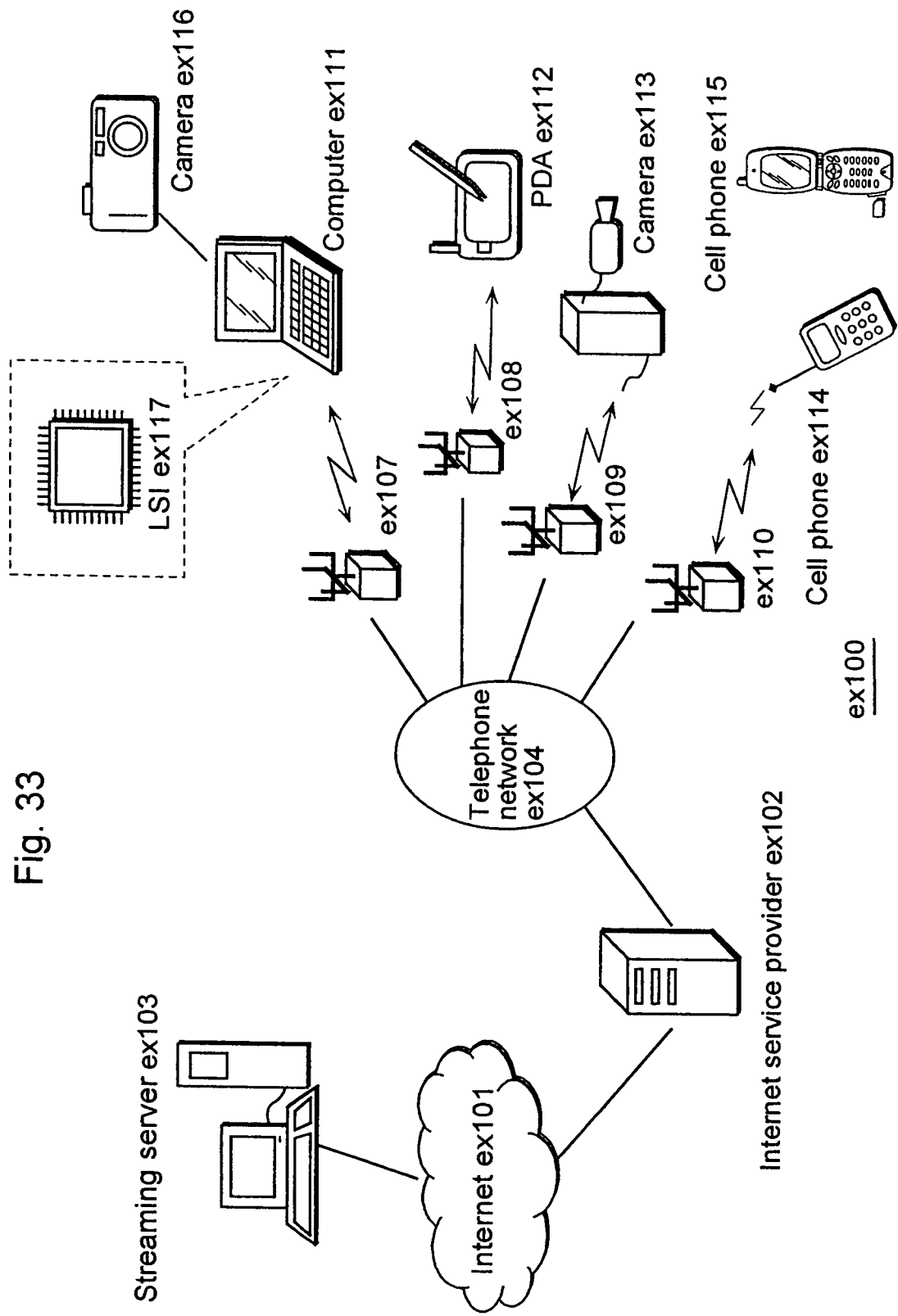
FIG. 33 is a block diagram showing a whole configuration of a content delivery system for realizing a content delivery service.

FIG. 33 is a block diagram showing an overall configuration of a content supply system ex100 for realizing content delivery service. The area for providing communication service is divided into cells of desired size, and cell sites ex107~ex110, which are fixed wireless stations, are placed in respective cells.

This content supply system ex100 is connected to apparatuses such as a computer ex111, a PDA (Personal Digital Assistant) ex112, a camera ex113, a cell phone ex114 and a cell phone with a camera ex115 via, for example, Internet ex101, an Internet service provider ex102, a telephone network ex104, as well as the cell sites ex107~ex110.

However, the content supply system ex100 is not limited to the configuration shown in FIG. 33 and may be connected to a combination of any of them. Also, each apparatus may be connected directly to the telephone network ex104, not through the cell sites ex107~ex110.

The camera ex113 is an apparatus capable of shooting video such as a digital video camera. The cell phone ex114 may be a cell phone of any of the following system: a PDC (Personal Digital Communications) system, a CDMA (Code Division Multiple Access) system, a W-CDMA (Wideband-Code Division Multiple Access) system or a GSM (Global System for Mobile Communications) system, a PHS (Personal Handyphone System) or the like.

A streaming server ex103 is connected to the camera ex113 via the telephone network ex104 and also the cell site ex109, which realizes a live distribution or the like using the camera ex113 based on the coded data transmitted from the user. Either of the camera ex113, the server which transmits the data and the like may code the data. The moving picture data shot by a camera ex116 may be transmitted to the streaming server ex103 via the computer ex111. In this case, either the camera ex116 or the computer ex111 may code the moving picture data. An LSI ex117 included in the computer ex111 and the camera ex116 performs the coding processing. Software for coding and decoding pictures may be integrated into any type of storage medium (such as a CD-ROM, a flexible disk and a hard disk) that is a recording medium which is readable by the computer ex111 or the like. Furthermore, a cell phone with a camera ex115 may transmit the moving picture data. This moving picture data is the data coded by the LSI included in the cell phone ex115.

The content supply system ex100 codes contents (such as a music live video) shot by a user using the camera ex113, the camera ex116 or the like in the same way as shown in the above-mentioned embodiment and transmits them to the streaming server ex103, while the streaming server ex103 makes stream delivery of the content data to the clients at their requests. The clients include the computer ex111, the PDA ex112, the camera ex113, the cell phone ex114 and so on capable of decoding the above-mentioned coded data. In the content supply system ex100, the clients can thus receive and reproduce the coded data, and can further receive, decode and reproduce the data in real time so as to realize personal broadcasting.

When each apparatus in this system performs coding or decoding, the picture coding apparatus or the picture decoding apparatus shown in the above-mentioned embodiment can be used.

A cell phone will be explained as an example of such apparatus.

Figure 34:
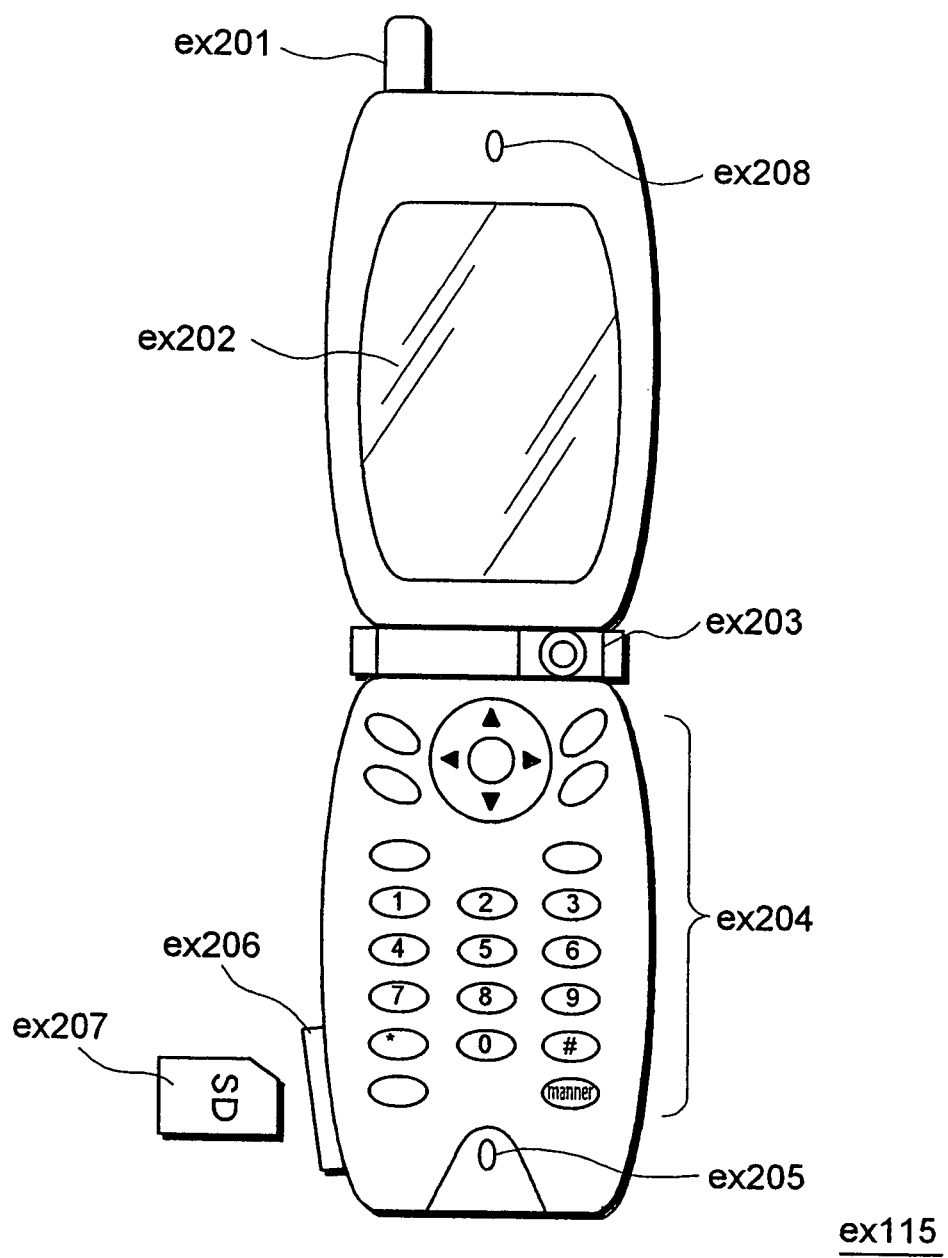
FIG. 34 is an illustration showing a cell phone using the moving picture prediction method, the moving picture coding apparatus and the moving picture decoding apparatus according to the present invention.

FIG. 34 is a diagram showing the cell phone ex115 using the picture coding/decoding method explained in the above-mentioned embodiments. The cell phone ex115 has an antenna ex201 for communicating with the cell site ex110 via radio waves, a camera unit ex203 such as a CCD camera capable of shooting moving and still pictures, a display unit ex202 such as a liquid crystal display for displaying the data such as decoded pictures and the like shot by the camera unit ex203 or received by the antenna ex201, a body unit including a set of operation keys ex204, an voice output unit ex208 such as a speaker for outputting voice, an voice input unit ex205 such as a microphone for inputting voice, a storage medium ex207 for storing coded or decoded data such as data of moving or still pictures shot by the camera, data of received e-mails and that of moving or still pictures, and a slot unit ex206 for attaching the storage medium ex207 to the cell phone ex115. The storage medium ex207 stores in itself a flash memory element, a kind of EEPROM (Electrically Erasable and Programmable Read Only Memory) that is a non-volatile memory electrically erasable from and rewritable to a plastic case such as an SD card.

Next, the cell phone ex115 will be explained with reference to FIG. 35. In the cell phone ex115, a main control unit ex311, designed in order to control overall each unit of the main body which contains the display unit ex202 as well as the operation keys ex204, is connected mutually to a power supply circuit unit ex310, an operation input control unit ex304, a picture coding unit ex312, a camera interface unit ex303, an LCD (Liquid Crystal Display) control unit ex302, a picture decoding unit ex309, a multiplexing/demultiplexing unit ex308, a read/write unit ex307, a modem circuit unit ex306 and an voice processing unit ex305 via a synchronous bus ex313.

When a call-end key or a power key is turned ON by a user's operation, the power supply circuit unit ex310 supplies the respective units with power from a battery pack so as to activate the digital cell phone with a camera ex115 as a ready state.

In the cell phone ex115, the voice processing unit ex305 converts the voice signals received by the voice input unit ex205 in conversation mode into digital voice data under the control of the main control unit ex311 including a CPU, ROM and RAM, the modem circuit unit ex306 performs spread spectrum processing on the digital voice data, and the communication circuit unit ex301 performs digital-to-analog conversion and frequency transformation on the data, so as to transmit it via the antenna ex201. Also, in the cell phone ex115, the communication circuit unit ex301 amplifies the data received by the antenna ex201 in conversation mode and performs frequency transformation and the analog-to-digital conversion on the data, the modem circuit unit ex306 performs inverse spread spectrum processing on the data, and the voice processing unit ex305 converts it into analog voice data so as to output it via the voice output unit ex208.

Furthermore, when transmitting an e-mail in data communication mode, the text data of the e-mail inputted by operating the operation keys ex204 of the main body is sent out to the main control unit ex311 via the operation input control unit ex304. In the main control unit ex311, after the modem circuit unit ex306 performs spread spectrum processing on the text data and the communication circuit unit ex301 performs the digital-to-analog conversion and the frequency transformation on the text data, the data is transmitted to the cell site ex110 via the antenna ex201.

When picture data is transmitted in data communication mode, the picture data shot by the camera unit ex203 is supplied to the picture coding unit ex312 via the camera interface unit ex303. When it is not transmitted, it is also possible to display the picture data shot by the camera unit ex203 directly on the display unit ex202 via the camera interface unit ex303 and the LCD control unit ex302.

The picture coding unit ex312, which includes the picture coding apparatus as described in the present invention, compresses and codes the picture data supplied from the camera unit ex203 using the coding method employed by the picture coding apparatus as shown in the first embodiment so as to transform it into coded image data, and sends it out to the multiplexing/demultiplexing unit ex308. At this time, the cell phone ex115 sends out the voice received by the voice input unit ex205 during the shooting with the camera unit ex203 to the multiplexing/demultiplexing unit ex308 as digital voice data via the voice processing unit ex305.

The multiplexing/demultiplexing unit ex308 multiplexes the coded image data supplied from the picture coding unit ex312 and the voice data supplied from the voice processing unit ex305, using a predetermined method, then the modem circuit unit ex306 performs spread spectrum processing on the multiplexed data obtained as a result of the multiplexing, and lastly the communication circuit unit ex301 performs digital-to-analog conversion and frequency transform on the data for the transmission via the antenna ex201.

As for receiving data of a moving picture file which is linked to a Web page or the like in data communication mode, the modem circuit unit ex306 performs inverse spread spectrum processing on the data received from the cell site ex110 via the antenna ex201, and sends out the multiplexed data obtained as a result of the inverse spread spectrum processing.

In order to decode the multiplexed data received via the antenna ex201, the multiplexing/demultiplexing unit ex308 demultiplexes the multiplexed data into a coded stream of image data and that of voice data, and supplies the coded image data to the picture decoding unit ex309 and the voice data to the voice processing unit ex305, respectively via the synchronous bus ex313.

Next, the picture decoding unit ex309, including the picture decoding apparatus as described in the present invention, decodes the coded stream of the image data using the decoding method corresponding to the coding method as shown in the above-mentioned embodiments to generate reproduced moving picture data, and supplies this data to the display unit ex202 via the LCD control unit ex302, and thus the image data included in the moving picture file linked to a Web page, for instance, is displayed. At the same time, the voice processing unit ex305 converts the voice data into analog voice data, and supplies this data to the voice output unit ex208, and thus the voice data included in the moving picture file linked to a Web page, for instance, is reproduced.

Figure 36:
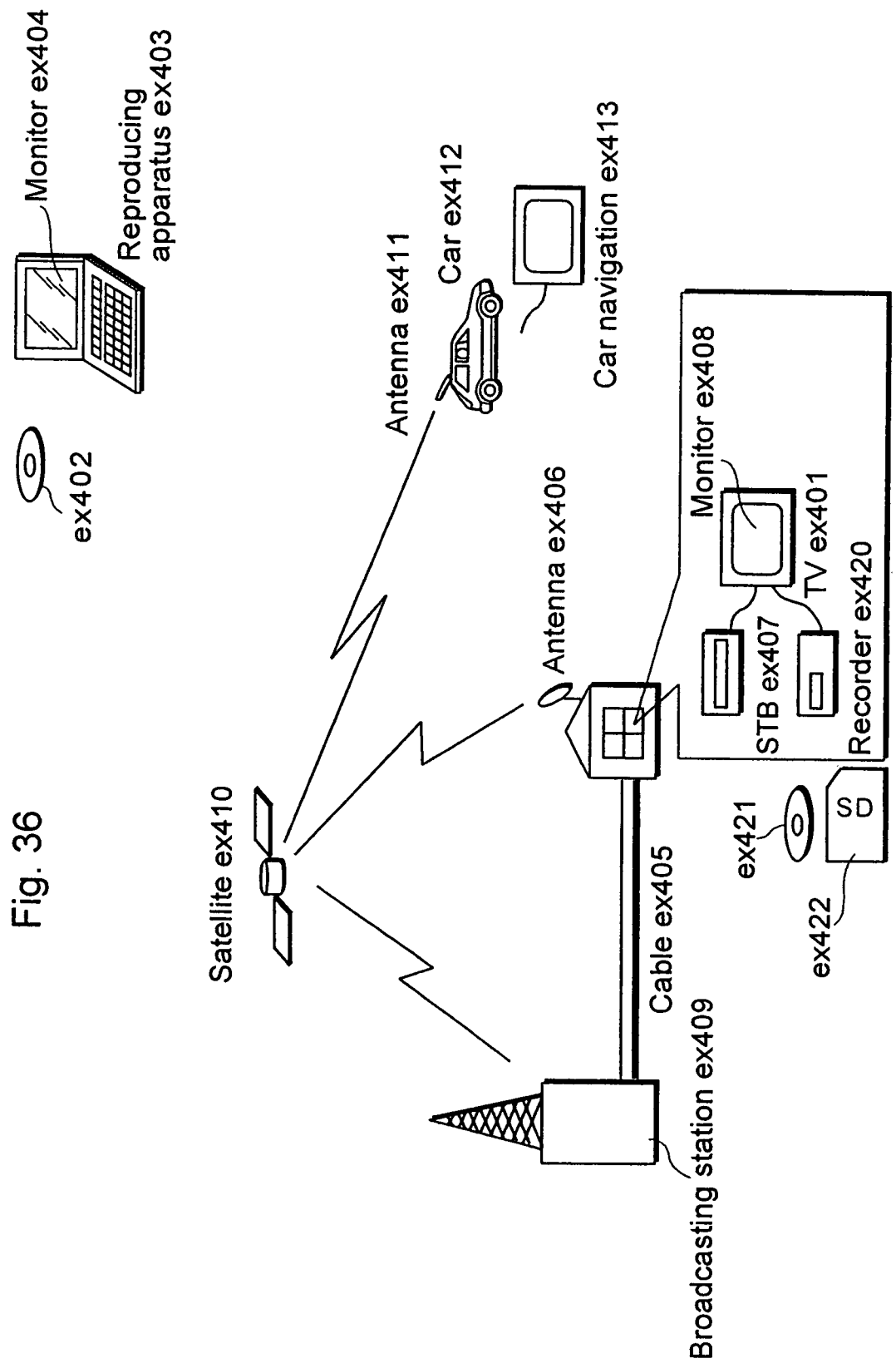
FIG. 36 is a block diagram showing a whole configuration of a digital broadcasting system according to the present invention.

The present invention is not limited to the above-mentioned system since ground-based or satellite digital broadcasting has been in the news lately and at least either the picture coding apparatus or the picture decoding apparatus described in the above-mentioned embodiment can be incorporated into a digital broadcasting system as shown in FIG. 36. More specifically, a coded stream of video information is transmitted from a broadcast station ex409 to or communicated with a broadcast satellite ex410 via radio waves. Upon receipt of it, the broadcast satellite ex410 transmits radio waves for broadcasting. Then, a home-use antenna ex406 with a satellite broadcast reception function receives the radio waves, and a television (receiver) ex401 or a set top box (STB) ex407 decodes a coded bit stream for reproduction. The picture decoding apparatus as shown in the above-mentioned embodiment can be implemented in the reproducing apparatus ex403 for reading out and decoding the coded stream recorded on a storage medium ex402 that is a recording medium such as a CD and a DVD. In this case, the reproduced moving picture signals are displayed on a monitor ex404. It is also conceivable to implement the picture decoding apparatus in the set top box ex407 connected to a cable ex405 for a cable television or the antenna ex406 for satellite and/or ground-based broadcasting so as to reproduce them on a monitor ex408 of the television ex401. The picture decoding apparatus may be incorporated into the television, not in the set top box. Also, a car ex412 having an antenna ex411 can receive signals from the satellite ex410 or the cell site ex107 for replaying moving picture on a display device such as a car navigation system ex413 set in the car ex412.

Furthermore, the picture coding apparatus as shown in the above-mentioned embodiment can code picture signals and record them on the storage medium. As a concrete example, a recorder ex420 such as a DVD recorder for recording picture signals on a DVD disk ex421, a disk recorder for recording them on a hard disk can be cited. They can be recorded on an SD card ex422. When the recorder ex420 includes the picture decoding apparatus as shown in the above-mentioned embodiment, the picture signals recorded on the DVD disk ex421 or the SD card ex422 can be reproduced for display on the monitor ex408.

Figure 35:
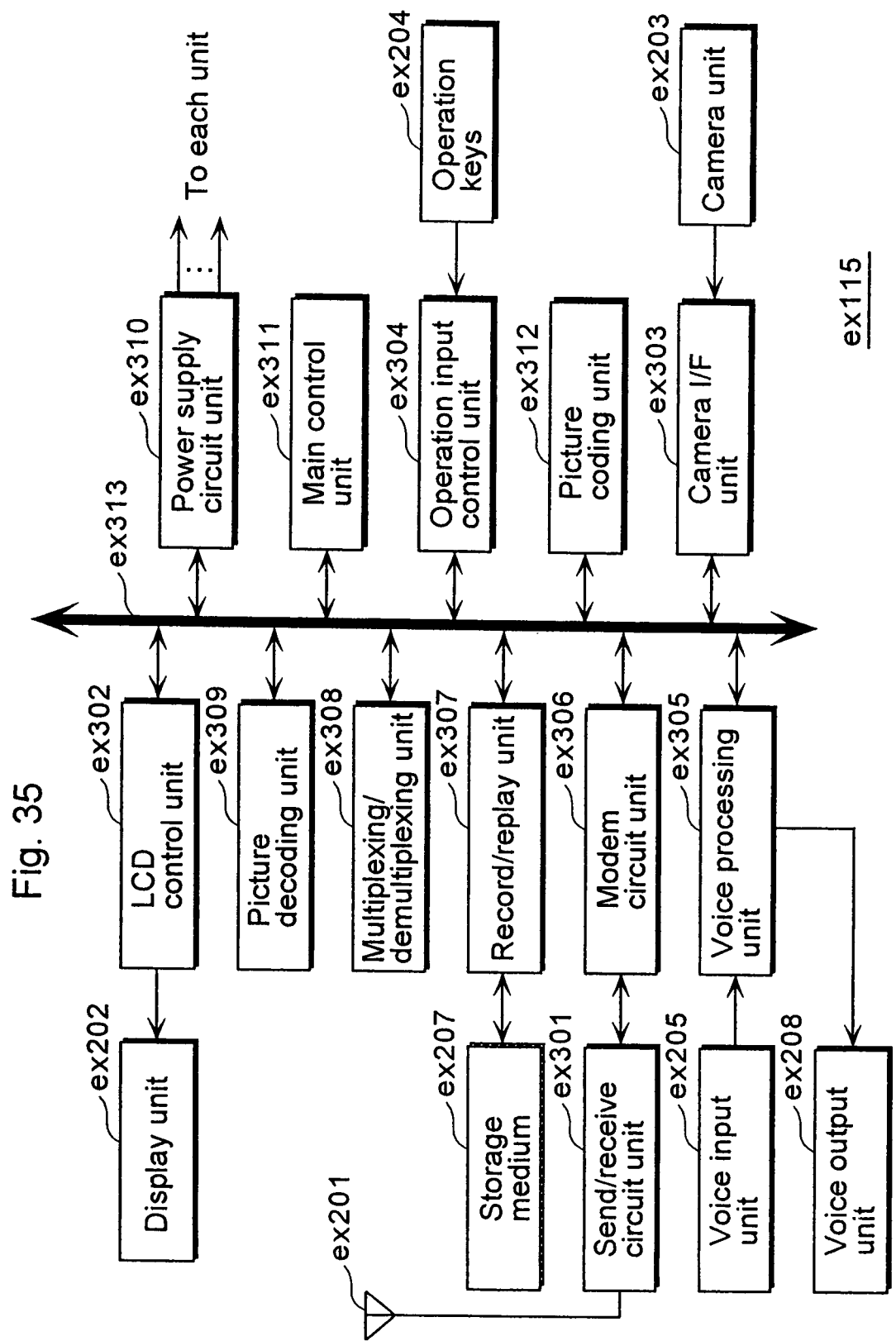
FIG. 35 is a block diagram showing a structure of a cell phone according to the present invention.

As for the structure of the car navigation system ex413, the structure without the camera unit ex203, the camera interface unit ex303 and the picture coding unit ex312, out of the components shown in FIG. 35, is conceivable. The same applies for the computer ex101, the television (receiver) ex401 and others.

In addition, three types of implementations can be conceived for a terminal such as the cell phone ex114: a sending/receiving terminal implemented with both an encoder and a decoder, a sending terminal implemented with an encoder only, and a receiving terminal implemented with a decoder only.

As described above, it is possible to use the variable length coding method, the variable length decoding method as well as the variable length coding apparatus and the variable length decoding apparatus that use these method, the moving picture coding method, the moving picture decoding method, the moving picture encoding apparatus and the moving picture decoding apparatus, described in the above-mentioned embodiment, for any of the above-mentioned apparatuses and systems described above, and by using these methods, the effects described in the above-mentioned embodiments can be obtained.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

It is described that the variable length coding apparatus and the variable length decoding apparatus according to the first through sixth embodiments performs scanning on the coefficients in an order starting at the low-frequency component toward the high-frequency component. However, the scanning may be performed in an order starting at the high-frequency component toward the low-frequency component. In this case, processing of reordering the coefficients can be abbreviated.

INDUSTRIAL APPLICABILITY

The variable length coding method and the variable length decoding method according to the present invention are applicable to code or decode coefficients in each block having a predetermined size, which are obtained by performing frequency transformation on picture data of a moving picture using a computer apparatus such as a cell phone, a personal digital assistant, a TV broadcasting apparatus, a TV monitor, a Set Top Box, or the like.

The invention claimed is:

1. A coding method for performing variable-length coding on two-dimensional coefficients of a block which are obtained by performing frequency transformation on picture data of the block that has a predetermined size of pixels, the method comprising:
   scanning the two-dimensional coefficients of the block in a predetermined order starting from a low frequency component toward a high frequency component so as to obtain scanned coefficients;
   performing variable-length coding on the scanned coefficients from a high frequency component toward a low frequency component using a plurality of variable length code tables;
   wherein each of the plurality of variable length code tables includes a plurality of variable length codes which correspond to the coefficients,
   wherein said performing variable-length coding comprises:
      coding a first coefficient using a first variable length code table of the plurality of variable length code tables;
      determining whether or not an absolute value of the first coefficient exceeds a first threshold value by comparing the absolute value of the first coefficient to the first threshold value;
      switching to a second variable length code table of the plurality of variable length code tables only when it is determined that the absolute value of the first coefficient exceeds the first threshold value;
      coding a second coefficient using the second variable length code table of the plurality of variable length code tables;
      determining whether or not an absolute value of the second coefficient exceeds a second threshold value by comparing the absolute value of the second coefficient to the second threshold value, the second threshold value being greater than the first threshold value;
      switching to a third variable length code table of the plurality of variable length code tables only when it is determined that the absolute value of the second coefficient exceeds the second threshold value;
      coding a third coefficient using the third variable length code table of the plurality of variable length code tables;
      determining whether or not an absolute value of the third coefficient exceeds a third threshold value by comparing the absolute value of the third coefficient to the third threshold value, the third threshold value being greater than the second threshold value;

switching to a fourth variable length code table of the plurality of variable length code tables only when it is determined that the absolute value of the third coefficient exceeds the third threshold value; and coding a fourth coefficient using the fourth variable length code table of the plurality of variable length code tables, wherein each of the first threshold value, the second threshold value, and the third threshold value is determined based on a rate of change in code length of the variable length codes included in each of the variable length code tables, and wherein the switching of the variable length code tables is performed in only one direction.

2. A coding apparatus that performs variable-length coding on two-dimensional coefficients of a block which are obtained by performing frequency transformation on picture data of the block that has a predetermined size of pixels, the apparatus comprising:

a scanning unit operable to scan the two-dimensional coefficients of the block in a predetermined order starting from a low frequency component toward a high frequency component so as to obtain scanned coefficients;

a variable length coding unit operable to perform variable-length coding on the scanned coefficients from a high frequency component toward a low frequency component using a plurality of variable length code tables;

wherein each of the plurality of variable length code tables includes a plurality of variable length codes which correspond to the coefficients, wherein said variable length coding unit is operable to:

code a first coefficient using a first variable length code table of the plurality of variable length code tables;

determine whether or not an absolute value of the first coefficient exceeds a first threshold value by comparing the absolute value of the first coefficient to the first threshold value;

switch to a second variable length code table of the plurality of variable length code tables only when it is determined that the absolute value of the first coefficient exceeds the first threshold value;

code a second coefficient using the second variable length code table of the plurality of variable length code tables;

determine whether or not an absolute value of the second coefficient exceeds a second threshold value by comparing the absolute value of the second coefficient to the second threshold value, the second threshold value being greater than the first threshold value;

switch to a third variable length code table of the plurality of variable length code tables only when it is determined that the absolute value of the second coefficient exceeds the second threshold value;

code a third coefficient using the third variable length code table of the plurality of variable length code tables;

determine whether or not an absolute value of the third coefficient exceeds a third threshold value by comparing the absolute value of the third coefficient to the third threshold value, the third threshold value being greater than the second threshold value;

switch to a fourth variable length code table of the plurality of variable length code tables only when it is determined that the absolute value of the third coefficient exceeds the third threshold value; and code a fourth coefficient using the fourth variable length code table of the plurality of variable length code tables, wherein each of the first threshold value, the second threshold value, and the third threshold value is determined based on a rate of change in code length of the variable length codes included in each of the variable length code tables, and wherein the switching of the variable length code tables is performed in only one direction.

* * * * *